United States Patent
Majhi et al.

(10) Patent No.: US 12,520,509 B2
(45) Date of Patent: Jan. 6, 2026

(54) DIODE STRUCTURE WITH BACKSIDE EPITAXIAL GROWTH

(71) Applicant: Intel Corporation, Santa Clara, CA (US)

(72) Inventors: Prashant Majhi, San Jose, CA (US); Anand Murthy, Portland, OR (US); Cory Bomberger, Portland, OR (US); Koustav Ganguly, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 869 days.

(21) Appl. No.: 17/557,756

(22) Filed: Dec. 21, 2021

(65) Prior Publication Data

US 2023/0197862 A1    Jun. 22, 2023

(51) Int. Cl.
*H10D 8/50*   (2025.01)
*H10D 8/01*   (2025.01)
*H10D 62/10*  (2025.01)

(52) U.S. Cl.
CPC ............... *H10D 8/50* (2025.01); *H10D 8/01* (2025.01); *H10D 62/117* (2025.01)

(58) Field of Classification Search
CPC .......... H10D 8/50; H10D 8/01; H10D 62/117; H10D 8/00; H10D 84/811; H10D 8/045; H10D 62/124; H10D 84/01; H10D 84/0193; H10D 84/853; H10D 30/62–6219; H10D 30/024–0245; H01L 23/14

See application file for complete search history.

(56) References Cited

U.S. PATENT DOCUMENTS

| | | | |
|---|---|---|---|
| 9,653,458 B1* | 5/2017 | Cheng | H10D 30/63 |
| 9,768,085 B1* | 9/2017 | Cheng | H10D 84/811 |
| 9,934,977 B1* | 4/2018 | Adusumilli | H10D 30/031 |
| 10,096,587 B1 | 10/2018 | Yu et al. | |
| 2014/0131831 A1 | 5/2014 | Wei et al. | |
| 2015/0014809 A1 | 1/2015 | Wang et al. | |

(Continued)

FOREIGN PATENT DOCUMENTS

WO    2018039645 A1    3/2018

OTHER PUBLICATIONS

Extended European Search Report received for EP Application No. 22201341.9 dated May 12, 2023. 9 pages.

*Primary Examiner* — Shahed Ahmed
(74) *Attorney, Agent, or Firm* — Finch & Maloney PLLC

(57) ABSTRACT

Techniques are provided herein to form a semiconductor diode device within an integrated circuit. In an example, a diode device includes separate fins or bodies of semiconductor material that are separated by an insulating barrier. One of the fins or bodies is doped with n-type dopants while the other fin or body is doped with p-type dopants. Each of the first and second fins or bodies includes an epitaxially grown region over it that includes the corresponding dopant type with a higher dopant concentration. Additionally, each of the first and second fins or bodies includes another epitaxially grown region on the backside (e.g., under the fins or bodies) of the corresponding dopant type with a lower dopant concentration compared to the epitaxial regions on the opposite side of the fins or bodies. An undoped or lightly doped layer may also be formed between the epitaxially grown regions on the backside.

20 Claims, 13 Drawing Sheets

(56) References Cited

U.S. PATENT DOCUMENTS

2017/0317212 A1* 11/2017 Kim .................... H10D 62/115
2019/0096917 A1    3/2019 Morrow et al.
2021/0249516 A1*  8/2021 Li ...................... H10D 84/0158
2024/0387274 A1* 11/2024 Yang ................... H10D 84/853

* cited by examiner

US 12,520,509 B2

DIODE STRUCTURE WITH BACKSIDE EPITAXIAL GROWTH

FIELD OF THE DISCLOSURE

The present disclosure relates to integrated circuits, and more particularly, to diode structures.

BACKGROUND

As integrated circuits continue to scale downward in size, a number of challenges arise. For instance, reducing the size of memory and logic cells is becoming increasingly more difficult. One possible solution that can be used to allow further scaling of cell size includes buried or backside power rail technology, or more generally BPR technology. In some cases, BPR technology includes forming such power rails on the backside of the structure (e.g., underneath the device layer) after removing the underlying substrate. Such BPR configurations free-up overhead to make more room for logic connections and enable further scaling of a standard logic cell (e.g., memory and logic cells). However, removing the substrate can make the formation of other integrated circuit devices like varactors and diodes more challenging. Accordingly, there remain a number of non-trivial challenges with respect to forming certain integrated circuit devices after removal of the underlying substrate.

Figure 1A:
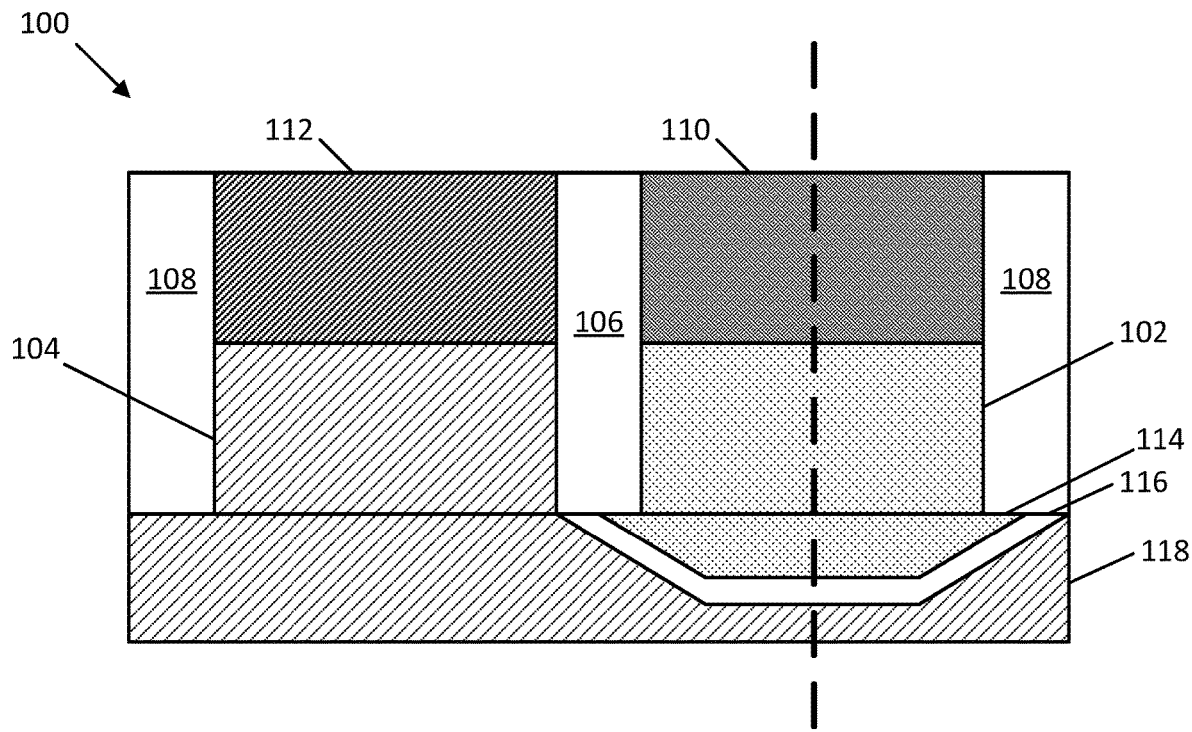
FIGS. 1A and 1B are different cross-sectional views of a semiconductor diode device that includes epitaxially formed backside regions, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Techniques are provided herein to form a semiconductor diode device within an integrated circuit, where the diode device includes backside epitaxial regions. The techniques can be used in any number of integrated circuit applications and are particularly useful with respect to forming diode structures integrated with logic and memory cells, such as those cells that use finFETs or gate-all-around (GAA) transistors. In an example, a diode device includes separate fins or bodies of semiconductor material that are separated by an insulating barrier. One of the fins or bodies is doped with n-type dopants while the other fin or body is doped with p-type dopants. Each of the first and second fins or bodies includes an epitaxially grown region over it that includes the corresponding dopant type with a higher dopant concentration. Additionally, each of the first and second fins or bodies includes another epitaxially grown region on the backside (e.g., under the fins or bodies) of the corresponding dopant type with a lower dopant concentration compared to the epitaxial regions on the opposite side of the fins or bodies. An undoped or otherwise lightly-doped (relative to the p and n regions) semiconductor layer may also be formed between the epitaxially grown regions on the backside. In this way, a p-n or p-i-n diode can be formed without an underlying semiconductor substrate by using regrowth of doped semiconductor material on the backside of the structure. Numerous variations and embodiments will be apparent in light of this disclosure.

General Overview

In many integrated circuit layouts, secondary active semiconductor devices such as varactors and diodes are integrated with the transistors on the same chip. Traditionally, such devices would often utilize the semiconductor substrate for forming either doped regions or other structures used by the devices. However, recent advances in integrated circuit technology have, in some cases, removed the semiconductor substrate in order to form backside power rails or other backside interconnect structures. While this provides benefits with regards to alleviating interconnect routing on the topside of the device, it has made it more difficult to form some secondary structures, such as semiconductor diodes. Some diode structures have been formed that utilize nanowires, nanoribbons, or a fin of semiconductor material between doped n and p regions, but these structures face challenges with regards to diode ideality, junction leakage, and high resistance.

Thus, and in accordance with an embodiment of the present disclosure, techniques are provided herein to form a semiconductor diode within an integrated circuit that utilizes backside epitaxially grown n-doped and p-doped regions. The loss of a semiconductor substrate when forming backside structures is overcome by essentially re-growing a portion of semiconductor material from the backside to form the diode p-n or p-i-n junction. The path between the higher doped n-region and p-region of the diode extends through fins or bodies of lighter doped semiconductor material and through lighter doped epitaxially grown semiconductor regions on the backside of the device. Any number of adjacent fins may be used to form a single diode device along with merged epitaxially grown regions on either ends of the fins. In some other embodiments, different fins or groups of fins may be used to form any number of different diode devices.

According to an embodiment, an integrated circuit includes a first fin of semiconductor material doped with a first dopant type at a first dopant concentration, a second fin of semiconductor material doped with a second dopant type at a second dopant concentration, and an insulating barrier between the first fin and the second fin. The integrated circuit further includes a first epitaxial region over and on the first fin, a second epitaxial region over and on the second fin, a third epitaxial region under and on the first fin, and a fourth epitaxial region under and on the second fin. The first epitaxial region has semiconductor material doped with the first dopant type at a third dopant concentration higher than the first dopant concentration. The second epitaxial region has semiconductor material doped with the second dopant type at a fourth dopant concentration higher than the second dopant concentration. The third epitaxial region has semiconductor material doped with the first dopant type at a fifth dopant concentration lower than the third dopant concentration. The fourth epitaxial region has semiconductor material doped with the second dopant type at a sixth dopant concentration lower than the fourth dopant concentration.

According to another embodiment, an integrated circuit includes a first body of semiconductor material doped with a first dopant type at a first dopant concentration, a second body of semiconductor material doped with a second dopant type at a second dopant concentration, and an insulating barrier between the first body and the second body. The integrated circuit further includes a first epitaxial region on a first end of the first body, a second epitaxial region on a first end of the second body, a third epitaxial region on a second end of the first body opposite from the first end of the first body, and a fourth epitaxial region on a second end of the second body opposite from the first end of the second body. The first epitaxial region has semiconductor material doped with the first dopant type at a third dopant concentration higher than the first dopant concentration. The second epitaxial region has semiconductor material doped with the second dopant type at a fourth dopant concentration higher than the second dopant concentration. The third epitaxial region has semiconductor material doped with the first dopant type at a fifth dopant concentration lower than the third dopant concentration. The fourth epitaxial region has semiconductor material doped with the second dopant type at a sixth dopant concentration lower than the fourth dopant concentration.

According to another embodiment, a method of forming an integrated circuit includes forming a fin of semiconductor material extending above a semiconductor substrate; doping a first portion of the fin with a first dopant type at a first dopant concentration and doping a second portion of the fin with a second dopant type at a second dopant concentration; forming an insulating barrier between the first portion of the fin and the second portion of the fin; growing a first epitaxial region on the first portion of the fin, the first epitaxial region having the first dopant type at a third dopant concentration higher than the first dopant concentration; growing a second epitaxial region on the second portion of the fin, the second epitaxial region having the second dopant type at a fourth dopant concentration higher than the second dopant concentration; removing the semiconductor substrate to expose a backside of the first portion of the fin and a backside of the second portion of the fin; growing a third epitaxial region on the backside of the first portion of the fin, the third epitaxial region having the first dopant type at a fifth dopant concentration lower than the third dopant concentration; and growing a fourth epitaxial region on the backside of the second portion of the fin, the fourth epitaxial region having the second dopant type at a sixth dopant concentration lower than the fourth dopant concentration.

The techniques can be used to form diode devices that can be integrated with any type of non-planar transistors, including finFETs (sometimes called double-gate transistors, or tri-gate transistors), or nanowire and nanoribbon transistors (sometimes called gate-all-around transistors), to name a few examples. Any number of semiconductor materials can be used in forming the n-doped and p-doped regions of the diode, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of one or more diode devices that include epitaxially grown n-doped and p-doped regions on both the frontside and backside of the device. Numerous configurations and variations will be apparent in light of this disclosure.

As used herein, the term "backside" generally refers to the area beneath one or more semiconductor devices (below the device layer) either within the device substrate or in the region of the device substrate (in the case where the bulk of the device substrate has been removed). Note that the backside may become a frontside, and vice-versa, if a given structure is flipped. To this end, it should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Architecture

Figure 1B:
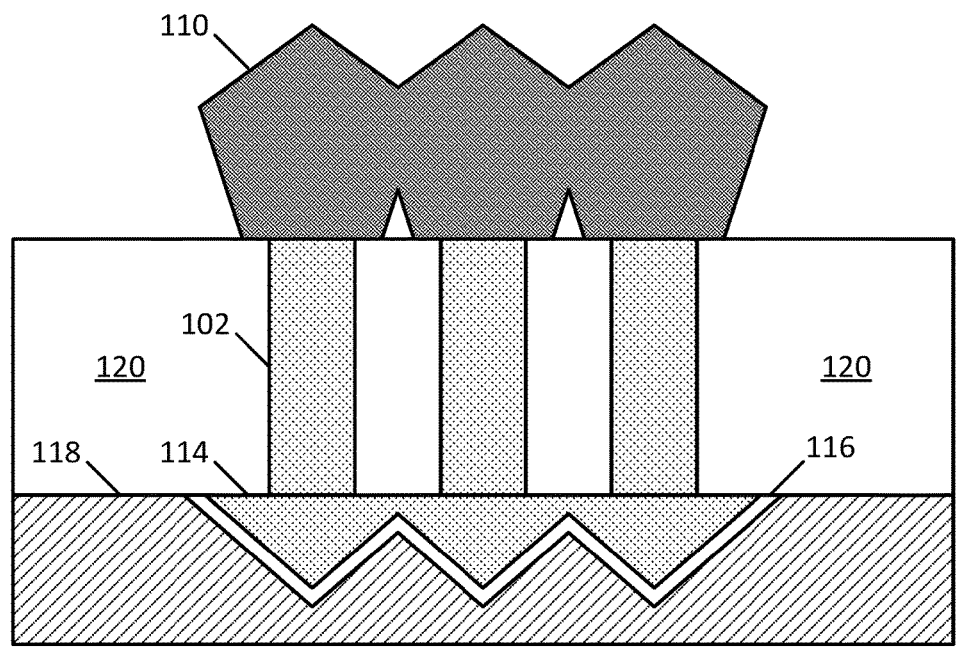

FIG. 1A shows a cross sectional view of a diode device 100 that is a part of a larger integrated circuit, according to an embodiment. FIG. 1B shows another cross sectional view of diode device 100 taken across the dotted line in FIG. 1A. Diode device 100 may represent a single device or any number of similar devices within the integrated circuit. According to some embodiments, the integrated circuit also includes a plurality of transistors, which may include planar and/or non-planar architectures such as finFET, gate-all-around (GAA), and forksheet transistors.

Diode device 100 may be made up of various doped semiconductor regions with some regions having a higher concentration of n-type dopants while other regions have a higher concentration of p-type dopants. According to some embodiments, diode device 100 includes a first fin 102 and a second fin 104 that can each include any semiconductor material, such as silicon. In some embodiments, first fin 102 and second fin 104 include the same semiconductor material. It should be understood that the term fin is not meant to be limiting with regards to the geometry of the structure and that first fin 102 and second fin 104 could also be any semiconductor bodies. First fin 102 and second find are doped with opposite dopant types. For example, first fin 102 may be doped with p-type dopants while second fin 104 is doped with n-type dopants, or vice-versa. An example of a p-type dopant includes boron while examples of n-type dopants include phosphorous or arsenic. In some embodiments, whichever of the fins is designated as p-type may include silicon germanium while the other n-type fin includes silicon. According to some embodiments, a dopant concentration of the p-type dopants within first fin 102 is between $10^{16}$ cm$^{-3}$ and $10^{18}$ cm$^{-3}$ and a dopant concentration of the n-type dopants within second fin 102 is also between $10^{16}$ cm$^{-3}$ and $10^{18}$ cm$^{-3}$. The same concentration ranges may be used if first fin 102 is n-type while second fin 104 is p-type.

According to some embodiments, first fin 102 and second fin 104 are isolated from each other by an insulating barrier 106 between first fin 102 and second fin 104. Insulating barrier 106 may be any suitable dielectric material, such as silicon oxide, silicon nitride, or silicon oxynitride, to name a few examples. Insulating barrier 106 may have a width extending between first fin 102 and second fin 104 that is between about 30 nm and about 80 nm. One or more other insulating plugs 108 may be used to isolate diode device 100 from other adjacent structures. Insulating plugs 108 may be the same dielectric material as insulating barrier 106, or any other suitable dielectric material.

According to some embodiments, a first epitaxial region 110 is grown on first fin 102. First epitaxial region 110 may include epitaxially formed semiconductor material that is substantially lattice matched with the semiconductor material of first fin 102. In some embodiments, the semiconductor material of first epitaxial region 110 is the same as the semiconductor material of first fin 102. First epitaxial region 110 includes a higher dopant concentration compared to the dopant concentration used in first fin 102. For example, first epitaxial region 110 may have a dopant concentration of p-type dopants between $10^{20}$ cm$^{-3}$ and $10^{21}$ cm$^{-3}$ while first fin 102 has a lower dopant concentration of p-type dopants.

According to some embodiments, a second epitaxial region 112 is grown on second fin 104. Second epitaxial region 112 may include epitaxially formed semiconductor material that is substantially lattice matched with the semiconductor material of second fin 104. In some embodiments, the semiconductor material of second epitaxial region 112 is the same as the semiconductor material of second fin 104. Second epitaxial region 112 includes a higher dopant concentration compared to the dopant concentration used in second fin 104. For example, second epitaxial region 112 may have a dopant concentration of n-type dopants between $10^{20}$ cm$^{-3}$ and $10^{21}$ cm$^{-3}$ while second fin 104 has a lower dopant concentration of n-type dopants. According to some embodiments, insulating barrier 106 also extends between first epitaxial region 110 and second epitaxial region 112.

According to some embodiments, a third epitaxial region 114 is grown on a backside of the structure and on a lower surface of first fin 102. Third epitaxial region 114 may include epitaxially formed semiconductor material that is substantially lattice matched with the semiconductor material of first fin 102. In some embodiments, the semiconductor material of third epitaxial region 114 is the same as the semiconductor material of first fin 102. According to some embodiments, third epitaxial region 114 includes a lower dopant concentration compared to the dopant concentration used in first epitaxial region 110. In one example, the dopant concentration of p-type dopants within third epitaxial region 114 is substantially the same (e.g., within 5%) as the dopant concentration of p-type dopants within first fin 102 (e.g., between $10^{16}$ cm$^{-3}$ and $10^{18}$ cm$^{-3}$).

A semiconductor layer 116 may be provided on a lower surface of third epitaxial region 114, according to some embodiments. Semiconductor layer 116 may also be epitaxially grown on third epitaxial region 114 to provide a lattice match at the boundary between third epitaxial region 114 and semiconductor layer 116. In some examples, semiconductor layer 116 is undoped or lightly-doped (relative to 114 and 118), so as to provide an intrinsic region of the diode structure (other embodiments may not have layer 116, so as to provide a p-n junction, rather than a p-i-n junction). In one example, semiconductor layer 116 is undoped or lightly-doped silicon, although any number of materials can be used to provide an intrinsic region, as will be appreciated.

According to some embodiments, a fourth epitaxial region 118 is grown on a backside of the structure and on a lower surface of second fin 104. Fourth epitaxial region 118 may include epitaxially formed semiconductor material that is substantially lattice matched with the semiconductor material of second fin 104. In some embodiments, the semiconductor material of fourth epitaxial region 118 is the same as the semiconductor material of second fin 104. According to some embodiments, fourth epitaxial region 118 includes a lower dopant concentration compared to the dopant concentration used in second epitaxial region 112. In one example, the dopant concentration of n-type dopants within fourth epitaxial region 118 is substantially the same (e.g., within 5%) as the dopant concentration of n-type dopants within second fin 104 (e.g., between $10^{16}$ cm$^{-3}$ and $10^{18}$ cm$^{-3}$). Fourth epitaxial region 118 may also be grown over semiconductor layer 116 to complete a p-i-n diode junction. In some embodiments, semiconductor layer 116 is omitted such that fourth epitaxial region 118 is grown over third epitaxial region 114 to complete a p-n diode junction.

It should be understood in the above discussion of the diode device that any of the described n-type regions could also be p-type regions while the described p-type regions could be n-type regions. The cross-section view of FIG. 1A illustrates a diode structure formed between two fins of semiconductor material, however, any number of adjacent fins may be linked together to form the diode structure. For example, the cross-section view in FIG. 1B illustrates three adjacent fins having first epitaxial region 110 and third epitaxial region 114 merged tougher amongst the fins to form a single diode structure. Although not shown, second epitaxial region 112 on adjacent fins could also be merged together as shown for first epitaxial region 110. Any number of fins may be used in this way.

A dielectric layer 120 may be present between adjacent fins such that each of the fins (including first fin 102 and second fin 104) extend through a thickness of dielectric layer 120. Dielectric layer 120 may be any suitable dielectric material such as silicon oxide, silicon nitride, or silicon oxynitride, to name a few examples. In some embodiments, dielectric layer 120 acts as a shallow trench isolation (STI) structure for transistors in other parts of the integrated circuit.

Conductive contacts may be present on the top surfaces of each of first epitaxial region 110 and second epitaxial region 112 to provide electrical contacts to diode device 100. Such conductive contacts may include tungsten or any other suitable conductive interconnect material. Additionally, one or more dielectric layers may be present both over and under diode device 100 to facilitate both topside and backside interconnect structures.

Fabrication Methodology

FIGS. 2A-10A and 2B-10B are cross-sectional views that collectively illustrate an example process for forming a diode device having backside epitaxially grown regions, in accordance with an embodiment of the present disclosure. FIGS. 2B-10B represent a cross-sectional view taken across the dotted line in the corresponding cross-sectional views of FIGS. 2A-10A. Each figure shows an example structure that results from the process flow up to that point in time, so the depicted structure evolves as the process flow continues, culminating in the structure shown in FIGS. 10A and 10B, which is similar to the structure shown in FIGS. 1A and 1B. Such a structure may be part of an overall integrated circuit (e.g., such as a processor or memory chip) that includes, for example, digital logic cells and/or memory cells and analog mixed signal circuitry. Thus, the illustrated diode device may be part of a larger integrated circuit that includes other integrated circuitry not depicted. Example materials and process parameters are given, but the present disclosure is not intended to be limited to any specific such materials or parameters, as will be appreciated. Figures sharing the same number (e.g., FIGS. 2A and 2B) illustrate different views of the structure at the same point in time during the process flow.

Figure 2A:
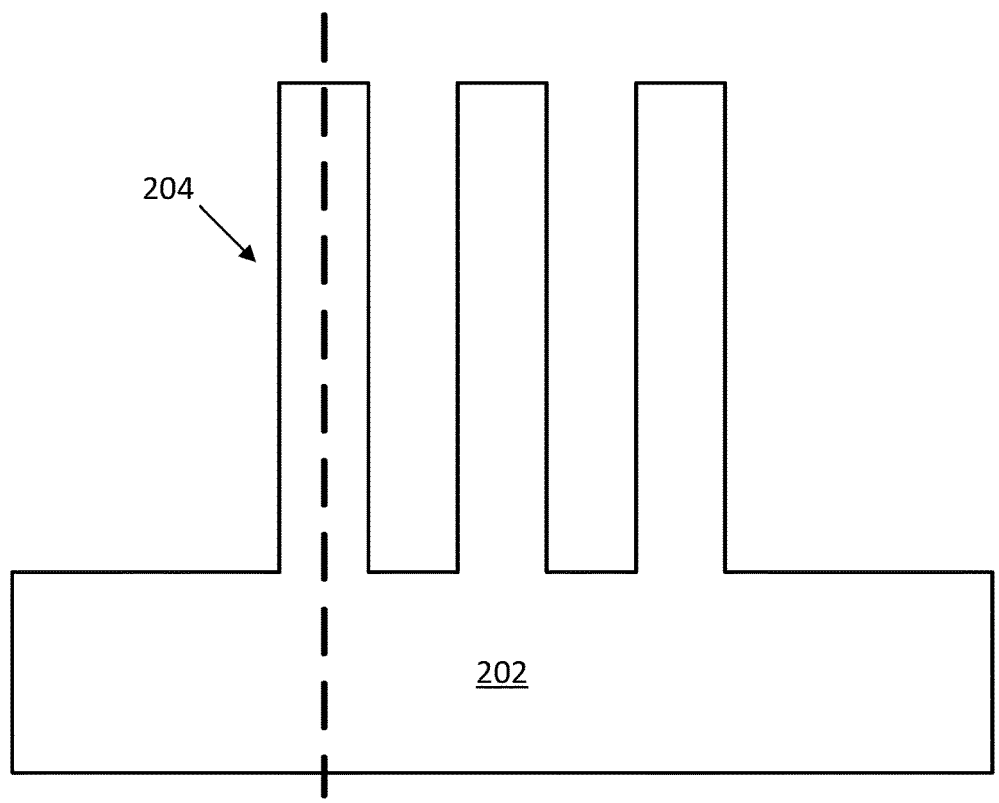
FIGS. 2A and 2B are different cross-sectional views that illustrate one stage in an example process for forming a semiconductor diode device that includes epitaxially formed backside regions, in accordance with an embodiment of the present disclosure.
Figure 2B:
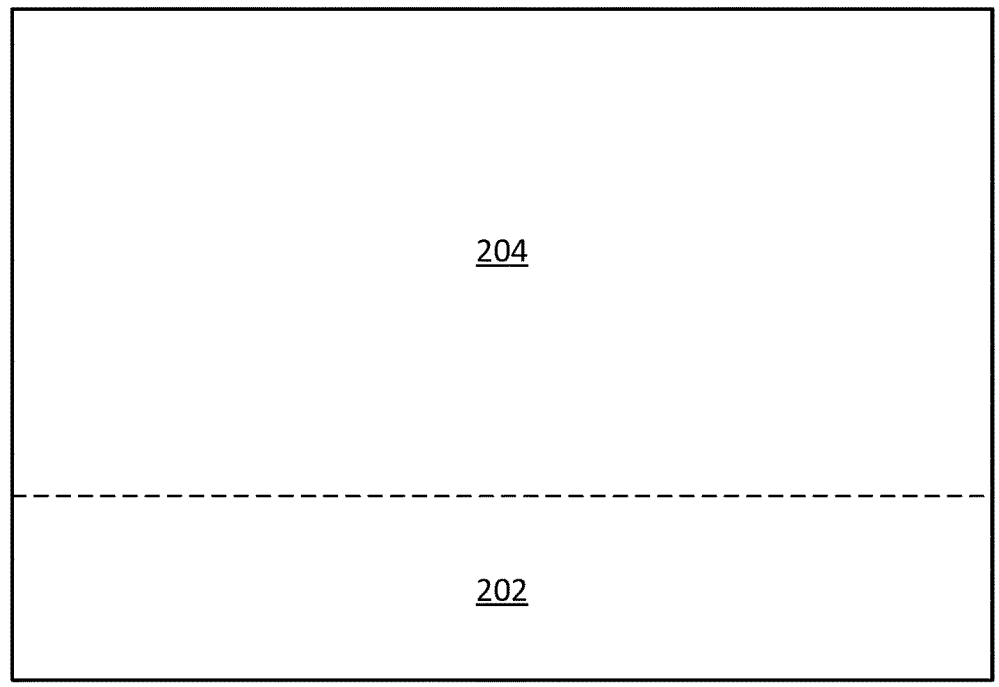

FIGS. 2A and 2B illustrate cross-sectional views taken across a group of fins (FIG. 2A) and through and parallel to one of the fins (FIG. 2B). Each of the fins may extend above a substrate 202. Any number of fins can be formed on substrate 202, but three are used here as an example. Substrate 202 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 202 can be a semiconductor-on-insulator substrate having a desired semiconductor layer over a buried insulator layer (e.g., silicon over silicon dioxide). Alternatively, substrate 202 can be a multilayer substrate or superlattice suitable for forming nanowires or nanoribbons (e.g., alternating layers of silicon and SiGe, or alternating layers indium gallium arsenide and indium phosphide). Any number of substrates can be used.

A single fin 204 is used herein as an example, however, the description with regards to fin 204 and the fabrication processes involved may be equally applicable to each of the other fins. Fin 204 can be native to substrate 202, as illustrated, or non-native to the substrate. In some examples, fin 204 includes alternating layers of material that may be used to form nanowires or nanoribbons from other fins of the integrated circuit. In other examples, fin 204 includes a single semiconductor material (e.g., silicon or germanium). According to some embodiments, the fins extend above substrate 202 to a height between about 100 nm and about 200 nm and have a width between about 5 nm and about 100 nm. The pitch between neighboring fins can be, for example, in the range of 25 to 600 nm. In some such example embodiments, a width-to-height aspect ratio of the fins is in the range of about 1:5 to 1:20, such as the specific example case where the fins are about 25 nm wide at their mid-point, and about 200 nm tall, so as to provide a 1:8 width-to-height aspect ratio. FIG. 2B illustrates the semiconductor material of fin 204 extending above the top surface of substrate 202 (as indicated by the thin dotted line).

Figure 3A:
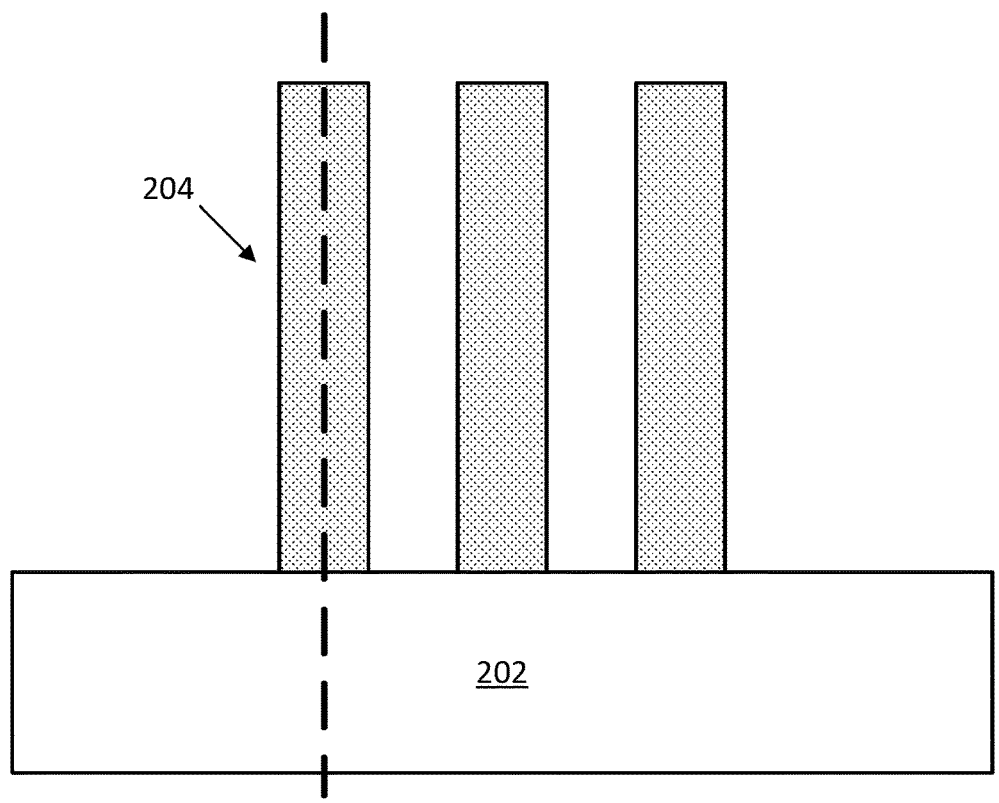
FIGS. 3A and 3B are different cross-sectional views that illustrate another stage in the example process for forming a semiconductor diode device that includes epitaxially formed backside regions, in accordance with an embodiment of the present disclosure.
Figure 3B:
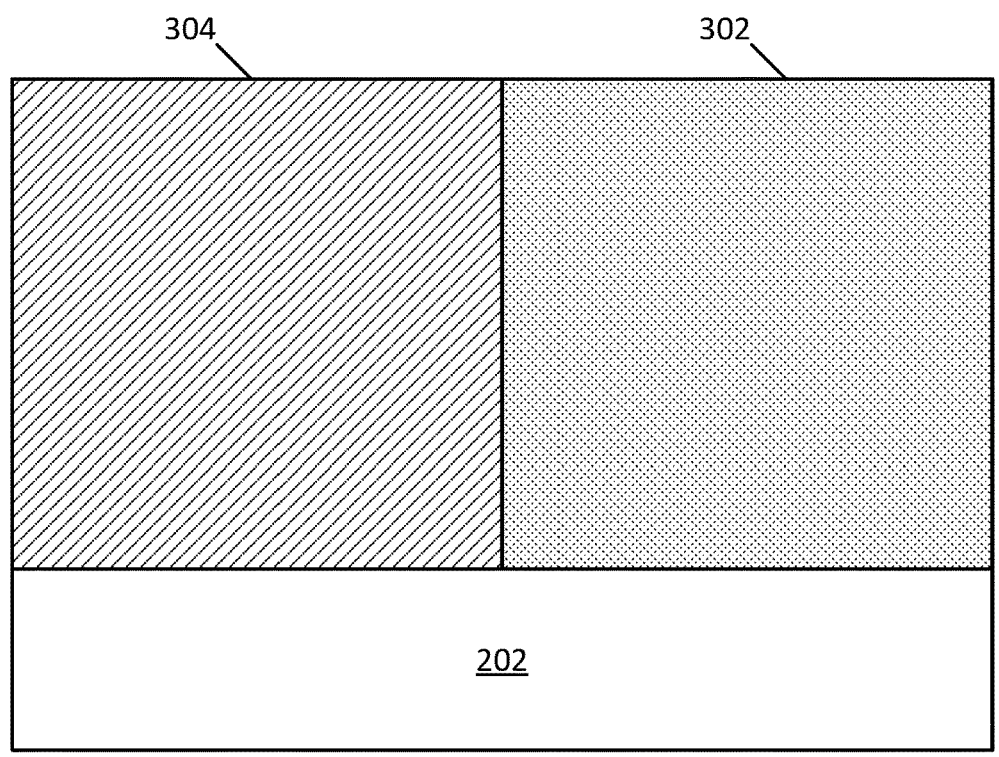

FIGS. 3A and 3B depict the cross-section views of the structure shown in FIGS. 2A and 2B, respectively, following doping of the fins. According to some embodiments, a first portion of fin 204 is doped with a first dopant type to form a first doped region 302 and a second portion of fin 204 is doped with a second dopant type to form a second doped region 304. Any doping process may be used to form the doped regions, such as diffusion or ion implantation to form one region while masking the other. In one example, first doped region 302 includes a concentration of p-type dopants in a range between $10^{16}$ cm$^{-3}$ and $10^{18}$ cm$^{-3}$ and second doped region 304 includes a concentration of n-type dopants in a range between $10^{16}$ cm$^{-3}$ and $10^{18}$ cm$^{-3}$. First doped region 302 may include substantially the same concentration of p-type dopants as the concentration of n-type dopants in second doped region 304.

First doped region 302 and second doped region 304 may be directly adjacent within fin 204, as illustrated. However, in some other embodiments, the dopant profiles of first doped region 302 and second doped region 304 do not overlap or abut such that a portion of fin 204 exists between first doped region 302 and second doped region 304 that is not doped via either doping process used to form first doped region 302 and second doped region 304. Furthermore, portions of substrate 202 may also be doped by either p-type or n-type dopants during the formation of first doped region 302 and second doped region 304. A concentration gradient of dopants may be present in each of first doped region 302 and second doped region 304 depending on the doping technique and process parameters used. It should be understood that the doping procedures may also be performed later in the fabrication process.

Figure 4A:
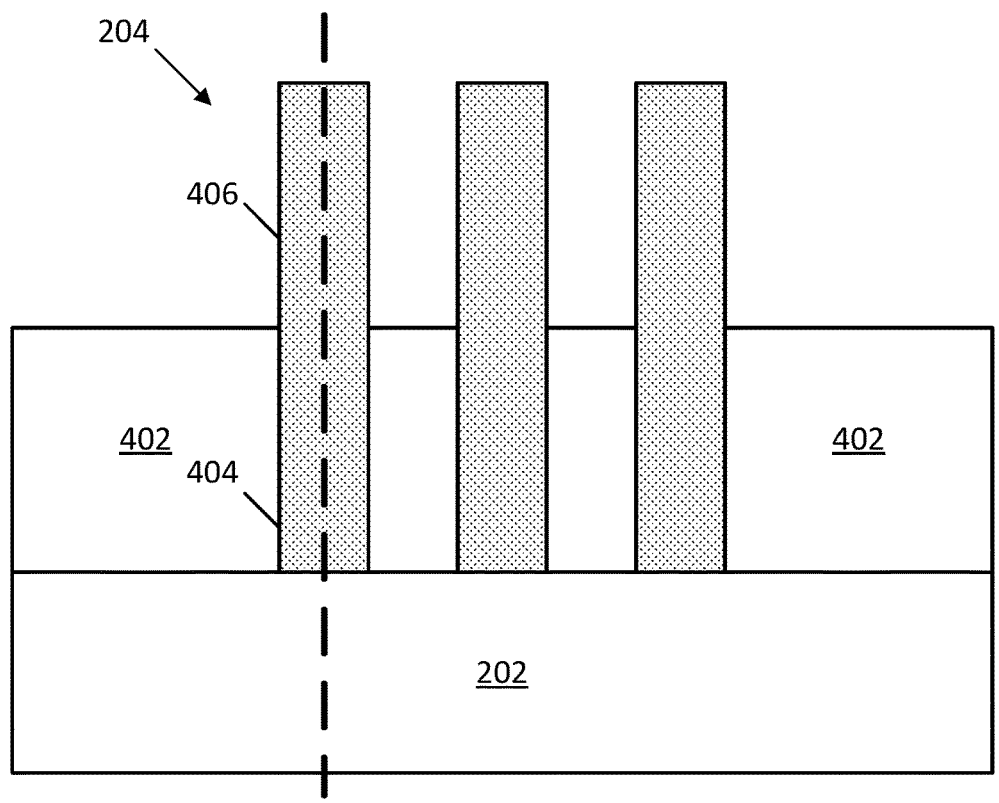
FIGS. 4A and 4B are different cross-sectional views that illustrate another stage in the example process for forming a semiconductor diode device that includes epitaxially formed backside regions, in accordance with an embodiment of the present disclosure.
Figure 4B:
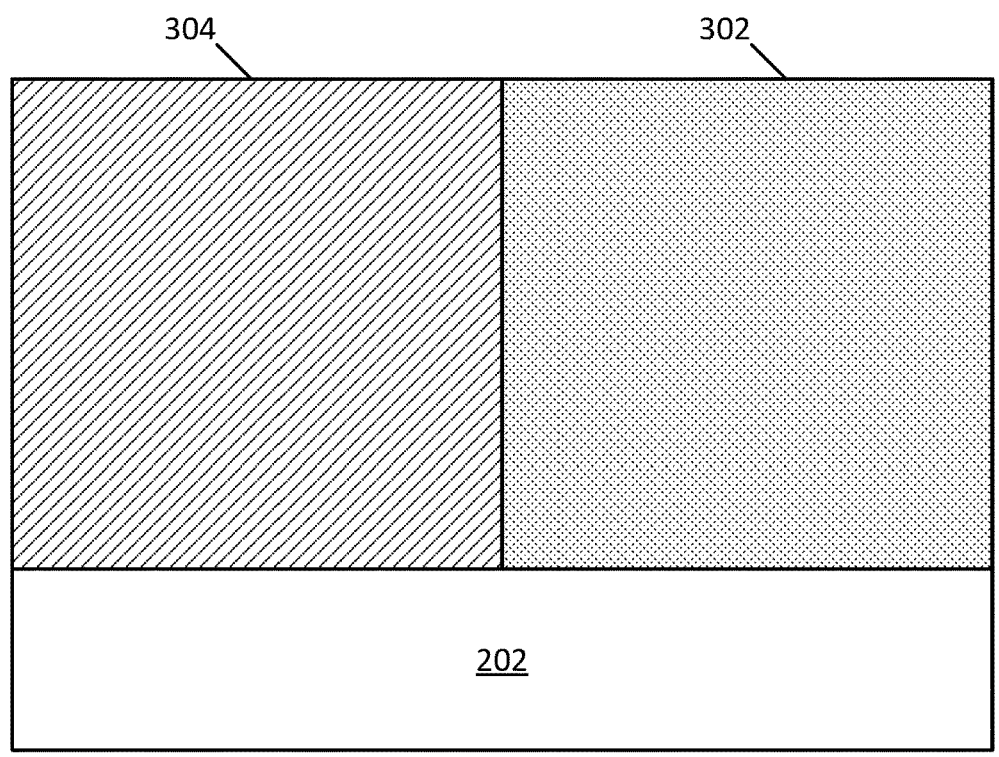

FIGS. 4A and 4B depict the cross-section views of the structure shown in FIGS. 3A and 3B, respectively, following the formation of a dielectric layer 402 between each of the fins. Dielectric layer 402 may be deposited using any known deposition technique such as chemical vapor deposition (CVD) or physical vapor deposition (PVD) and polished to a same height as the fins using, for example, chemical mechanical polishing (CMP). Then, dielectric layer 402 may be recessed to a final height between about 50 nm and about 100 nm. Dielectric layer 402 may be any suitable dielectric material, such as silicon oxide, silicon nitride, or silicon oxynitride.

The presence of dielectric layer 402 separates fin 204 into a subfin portion 404 that is within dielectric layer 402 and an upper portion 406 that extends above a top surface of dielectric layer 402. According to some embodiments, the upper portion 406 is used to form transistor devices such as finFET, GAA, or forksheet transistors in other fins on the integrated circuit. Subfin portions 404 are used as the fin structures in the diode device as further described herein. As noted above, the doping procedures to form first doped region 302 and second doped region 304 may be performed after the formation of dielectric layer 402.

Figure 5A:
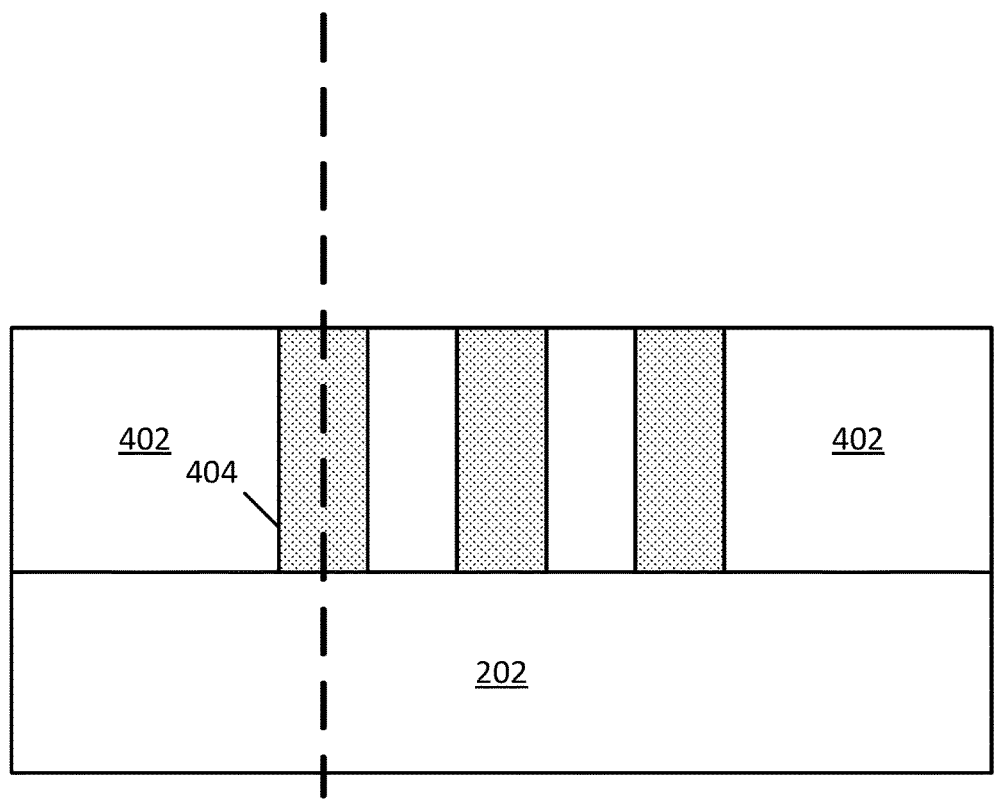
FIGS. 5A and 5B are different cross-sectional views that illustrate another stage in the example process for forming a semiconductor diode device that includes epitaxially formed backside regions, in accordance with an embodiment of the present disclosure.
Figure 5B:
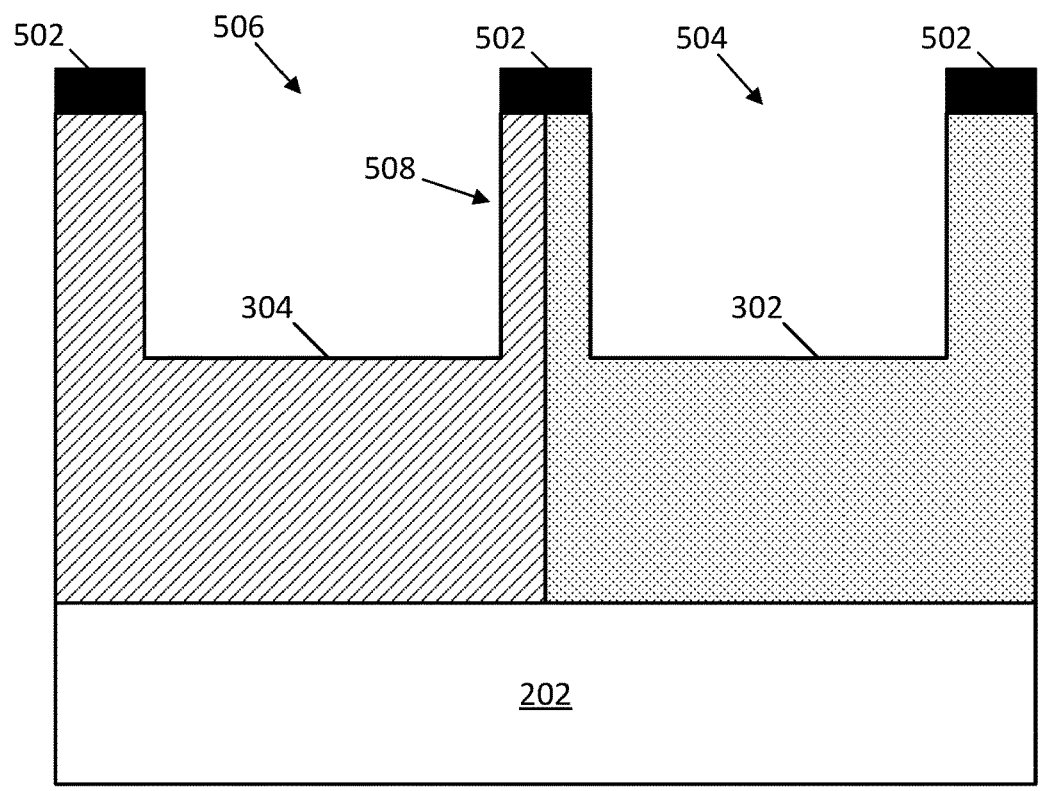

FIGS. 5A and 5B depict the cross-section views of the structure shown in FIGS. 4A and 4B, respectively, following the removal of a portion of fin 204. According to some embodiments, a masking layer 502 is formed to protect portions of the exposed upper portions 406 of the fins. Masking layer 502 may be a strip of material that runs orthogonal to the length of the fins to protect the underlying fin portions from an anisotropic etch used to remove the unprotected portions (i.e. those portions not under masking layer 502). Masking layer 502 may be a carbon hard mask (CHM), photoresist, or any other hard mark material that can be selectively removed following the etching process.

After patterning masking layer 502, a dry anisotropic etching process, such as reactive ion etching (RIE), may be used to form a first recess 504 through first doped region 302 and a second recess 506 through second doped region 304 of fin 204. According to some embodiments, each of recess 504 and 506 extends down to about the same height as the top surface of dielectric layer 402. According to some embodiments, first recess 504 and second recess 506 are separated from each other by a pillar 508 of semiconductor fin material. Pillar 508 may include both n-type dopants and p-type dopants from each of first doped region 302 and second doped region 304. According to some embodiments, the anisotropic etch used to form first recess 504 and second recess 506 may be the same etch that is used to form source and drain trenches adjacent to other fins of the integrated circuit in order to form transistor devices.

Figure 6A:
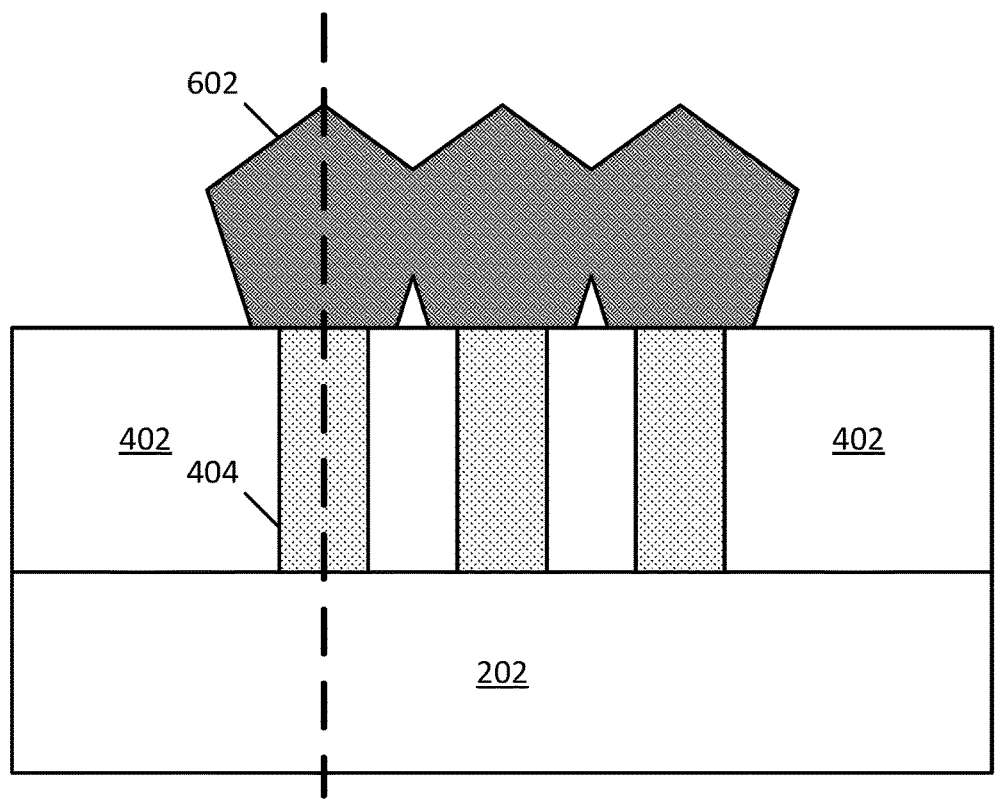
FIGS. 6A and 6B are different cross-sectional views that illustrate another stage in the example process for forming a semiconductor diode device that includes epitaxially formed backside regions, in accordance with an embodiment of the present disclosure.
Figure 6B:
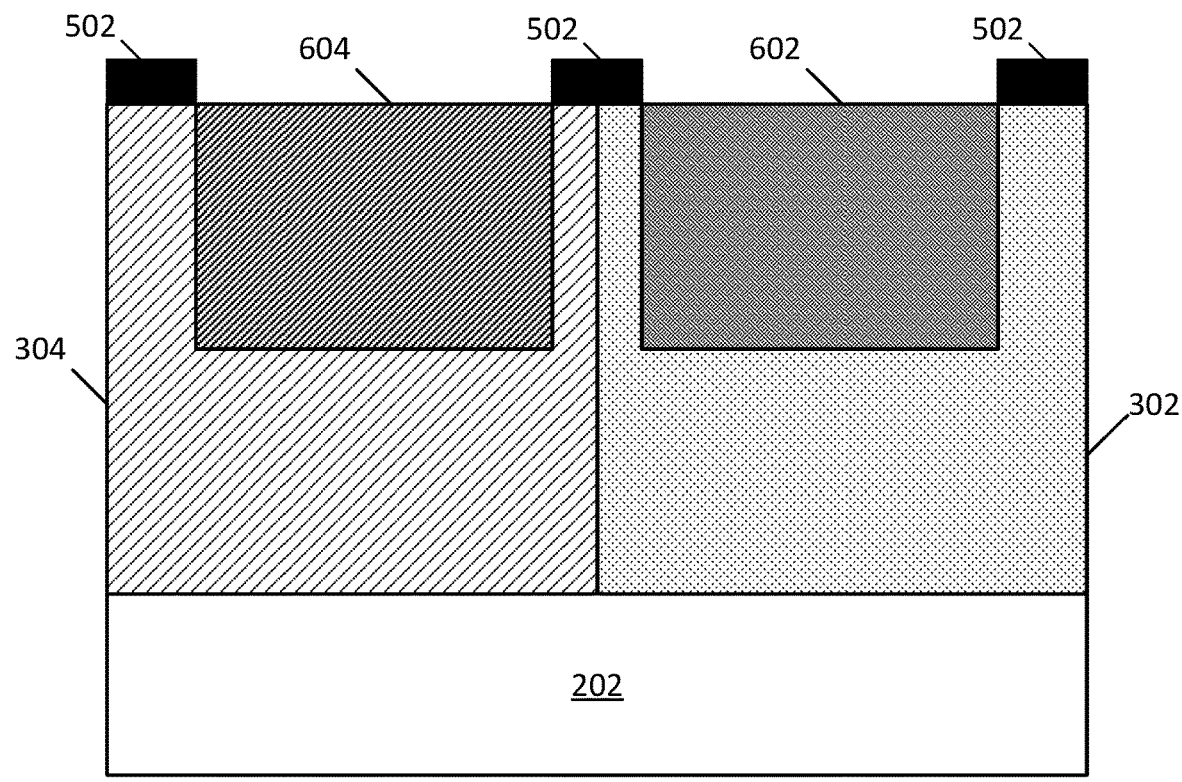

FIGS. 6A and 6B depict the cross-section views of the structure shown in FIGS. 5A and 5B, respectively, following the growth of first epitaxial region 602 and the growth of second epitaxial region 604. According to some embodiments, first epitaxial region 602 includes a semiconductor material having a higher dopant concentration of the same dopant type as first doped region 302. For example, first epitaxial region 602 may include a semiconductor material having a concentration of p-type dopants between $10^{20}$ cm$^{-3}$ and $10^{21}$ cm$^{-3}$. The semiconductor material of first epitaxial region 602 may be the same semiconductor material of first doped region 302 (e.g., silicon). According to some embodiments, first epitaxial region 602 may be grown from all exposed surfaces within recess 504 to substantially fill recess 504. As observed in FIG. 6A, the epitaxial growth process may result in a geometry that follows certain crystallographic planes. The growth of first epitaxial region 602 of fin 204 may merge with any other first epitaxial regions from adjacent fins as shown in FIG. 6A.

According to some embodiments, second epitaxial region 604 includes a semiconductor material having a higher dopant concentration of the same dopant type as second doped region 304. For example, second epitaxial region 604 may include a semiconductor material having a concentration of n-type dopants between $10^{20}$ cm$^{-3}$ and $10^{21}$ cm$^{-3}$. The semiconductor material of second epitaxial region 604 may be the same semiconductor material of second doped region 304 (e.g., silicon). According to some embodiments, second epitaxial region 604 may be grown from all exposed surfaces within recess 506 to substantially fill recess 506. In some embodiments, second epitaxial region 604 includes substantially the same concentration of n-type dopants as p-type dopants within first epitaxial region 602.

Figure 7A:
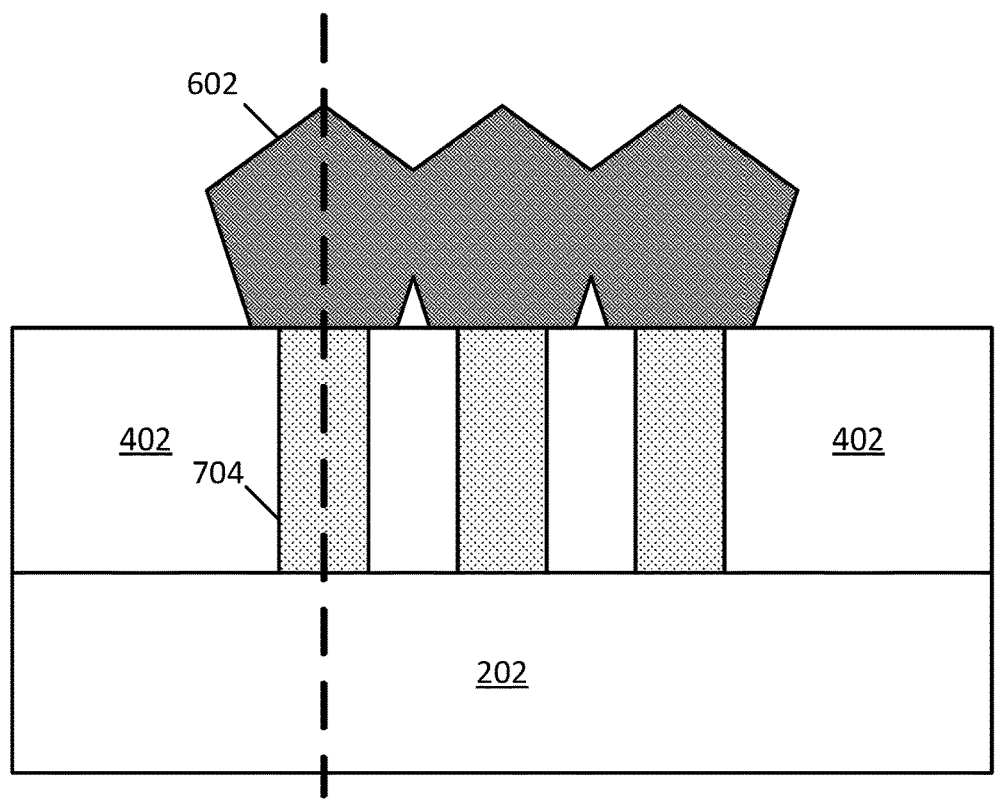
FIGS. 7A and 7B are different cross-sectional views that illustrate another stage in the example process for forming a semiconductor diode device that includes epitaxially formed backside regions, in accordance with an embodiment of the present disclosure.
Figure 7B:
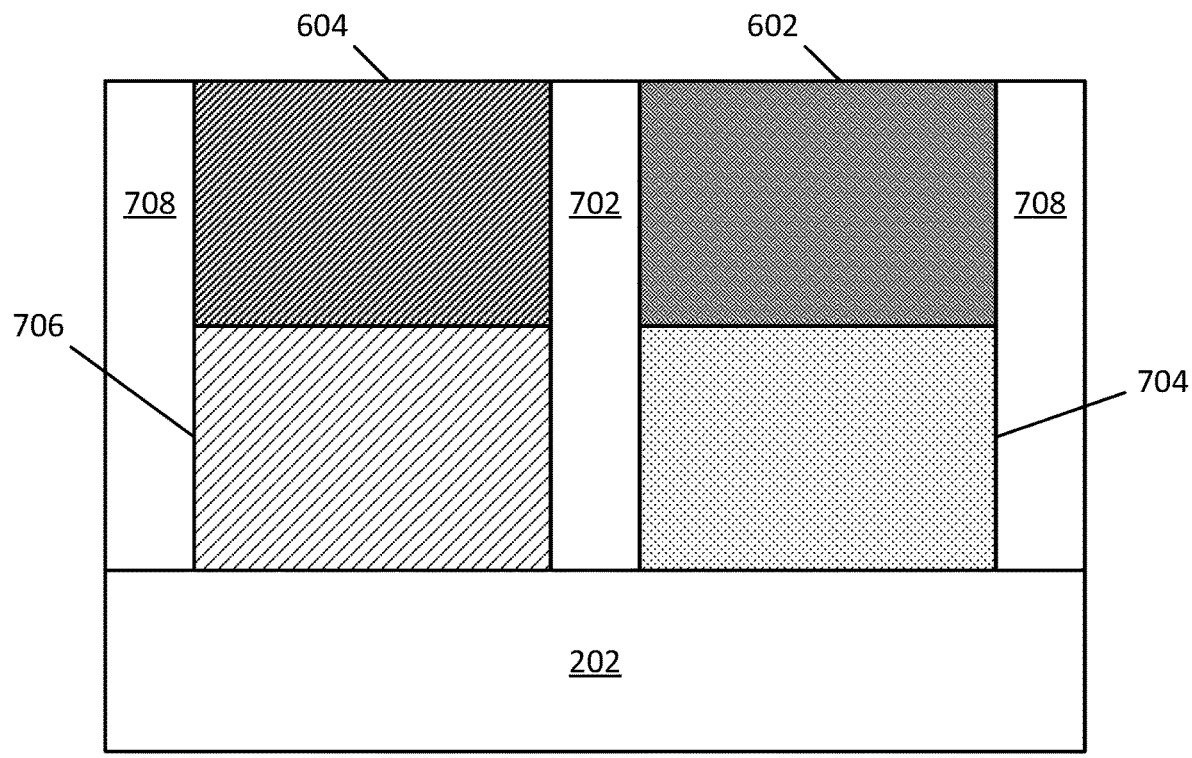

FIGS. 7A and 7B depict the cross-section views of the structure shown in FIGS. 6A and 6B, respectively, following the formation of an insulating barrier 702 between the oppositely doped regions, according to an embodiment. Due to the formation of various insulating barriers, the subfin portion of fin 204 has been sectioned into a first fin 704 having the doping profile of first doped region 302 and a second fin 706 having the doping profile of second doped region 304. Insulating barrier 702 electrically isolates the n-type and p-type regions from each other.

According to some embodiments, an anisotropic etch is performed between first epitaxial region 602 and second epitaxial region 604 that extends down through the height of fin 204 until at least a portion of substrate 202 is exposed. The recess formed by the etch may then be filled with any suitable dielectric material to form insulating barrier 702. One example dielectric material is silicon oxide. As noted above, other dielectric barriers 708 may also be formed to isolate each of first fin 704 and second fin 706 from any other adjacent devices. Insulating barrier 702 may have a width between first fin 704 and second fin 706 of between about 50 nm and about 100 nm.

Figure 8A:
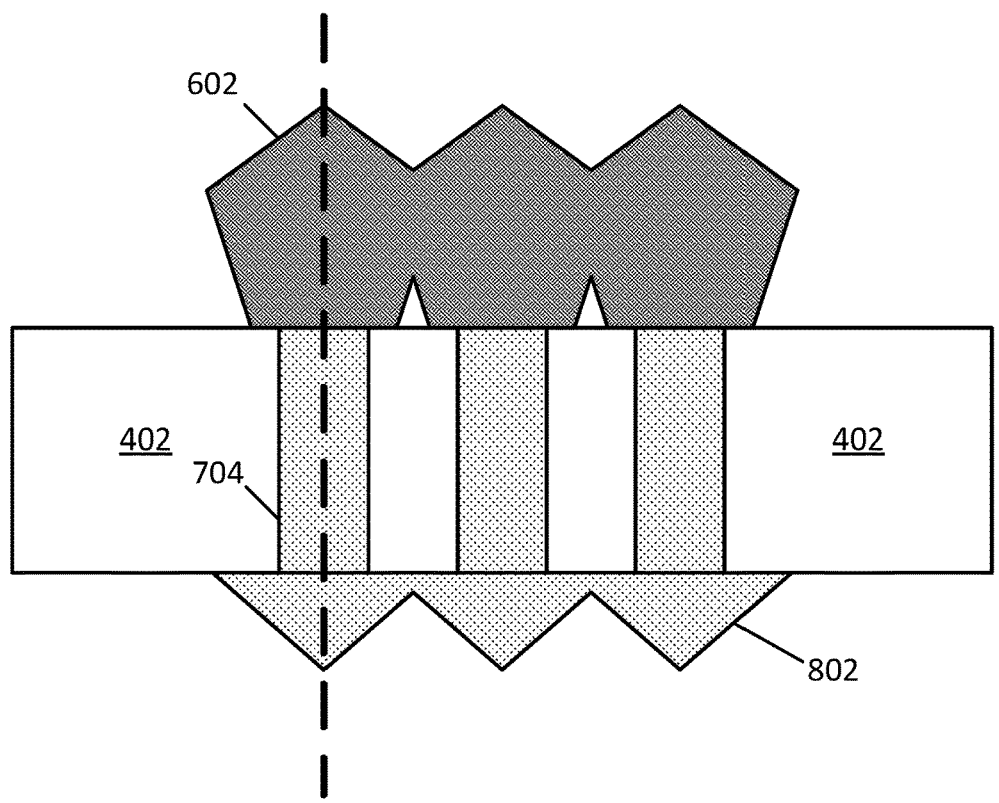
FIGS. 8A and 8B are different cross-sectional views that illustrate another stage in the example process for forming a semiconductor diode device that includes epitaxially formed backside regions, in accordance with an embodiment of the present disclosure.
Figure 8B:
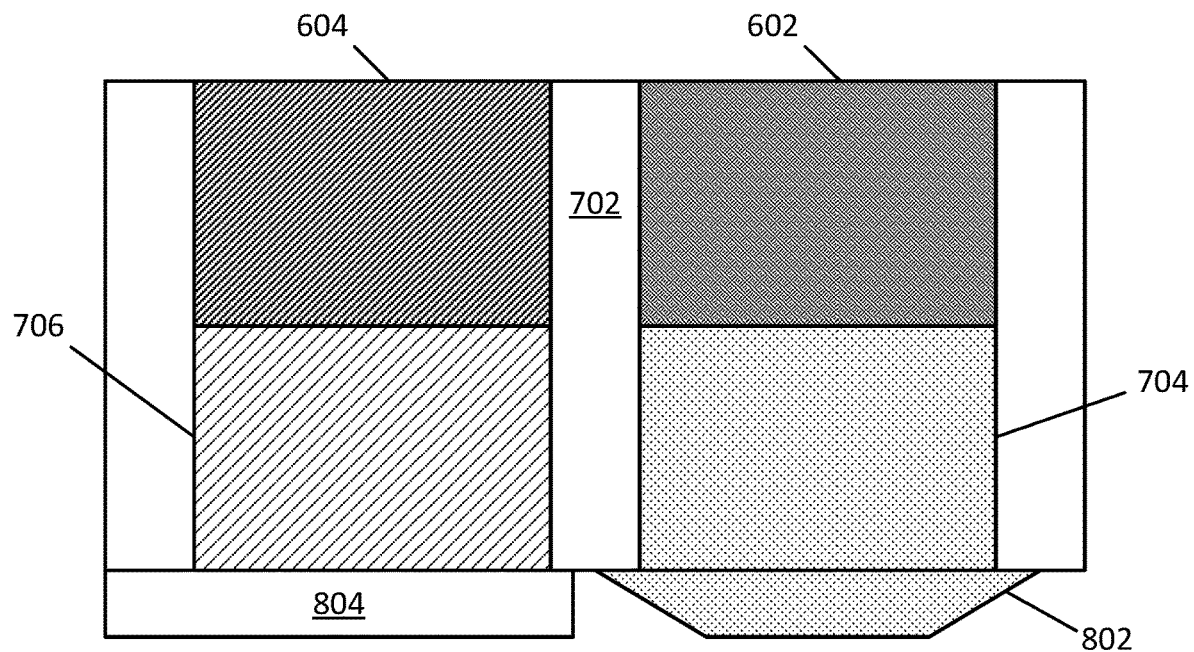

FIGS. 8A and 8B depict the cross-section views of the structure shown in FIGS. 7A and 7B, respectively, following the removal of substrate 202 and the formation of a third epitaxial region 802 beneath first fin 704, according to an embodiment. Third epitaxial region 802 may be formed using selective epitaxy such that it only forms on the exposed bottom surface of first fin 704 (e.g., as opposed to any exposed oxide surfaces). Substrate 202 may be removed using any number of various grinding and/or polishing steps to whittle down the thickness from the backside until the bottom surface of dielectric layer 402 is exposed. According to some embodiments, the substrate removal is performed after all frontside processing has been completed, including the formation of other transistor devices in the integrated circuit and frontside interconnect structures like contacts to first epitaxial region 602 and second epitaxial region 604.

According to some embodiments, third epitaxial region 802 is epitaxially grown from the exposed bottom surface of first fin 704. The exposed bottom surface of second fin 706 may be protected using a hard mask layer 804 during the growth of epitaxial material from first fin 704. Because many device structures could be sensitive to high growth temperatures, the epitaxial growth process used to form third epitaxial region 802 may be done at a lower temperature, such as between about 350° C. and 450° C. According to some embodiments, third epitaxial region 802 includes a dopant concentration of the same dopant type as first fin 704 and first epitaxial region 602 that is less than the dopant concentration of the first epitaxial region 602. In some examples, third epitaxial region 802 includes a dopant concentration that is substantially the same as a dopant concentration of first fin 704. According to an embodiment, third epitaxial region 802 includes a dopant concentration of p-type dopants between $10^{16}$ cm$^{-3}$ and $10^{18}$ cm$^{-3}$.

Figure 9A:
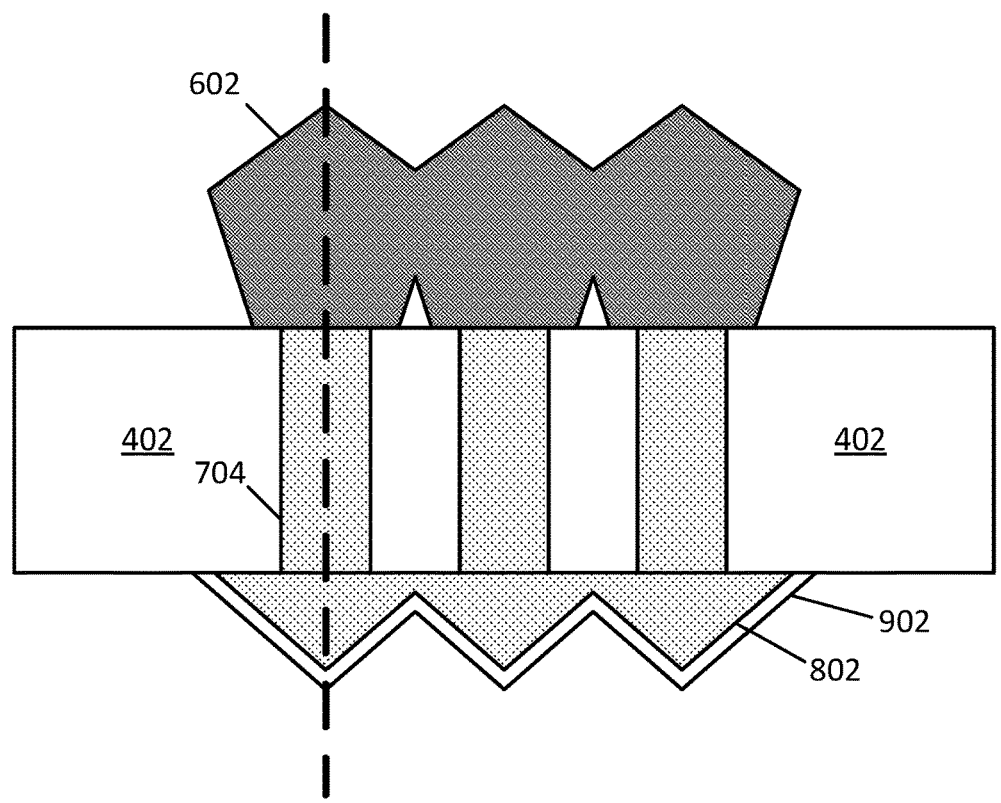
FIGS. 9A and 9B are different cross-sectional views that illustrate another stage in the example process for forming a semiconductor diode device that includes epitaxially formed backside regions, in accordance with an embodiment of the present disclosure.
Figure 9B:
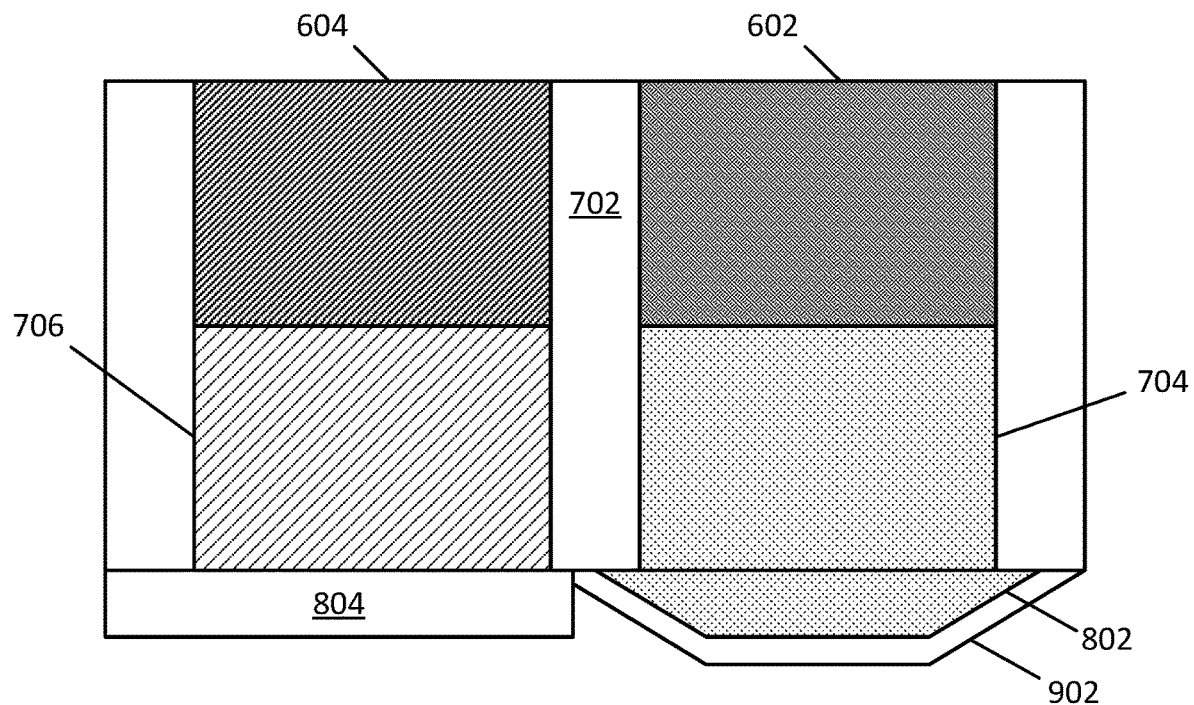

FIGS. 9A and 9B depict the cross-section views of the structure shown in FIGS. 8A and 8B, respectively, following the formation of a semiconductor layer 902 over third epitaxial region 802, according to an embodiment. Semiconductor layer 902 may be epitaxially grown on the bottom surface of third epitaxial region 802, and thus may include the same semiconductor material as third epitaxial region 802 (e.g., silicon). According to some embodiments, semiconductor layer 902 does not include any added doping and thus is an undoped or intrinsic layer of semiconductor material. Accordingly, semiconductor layer 902 can act as an intrinsic region of a PIN-type junction. Semiconductor layer 902 may have a thickness between about 5 nm and about 20 nm, in some examples. According to an embodiment, semiconductor layer 902 contacts a lower surface of insulating barrier 702.

Figure 10A:
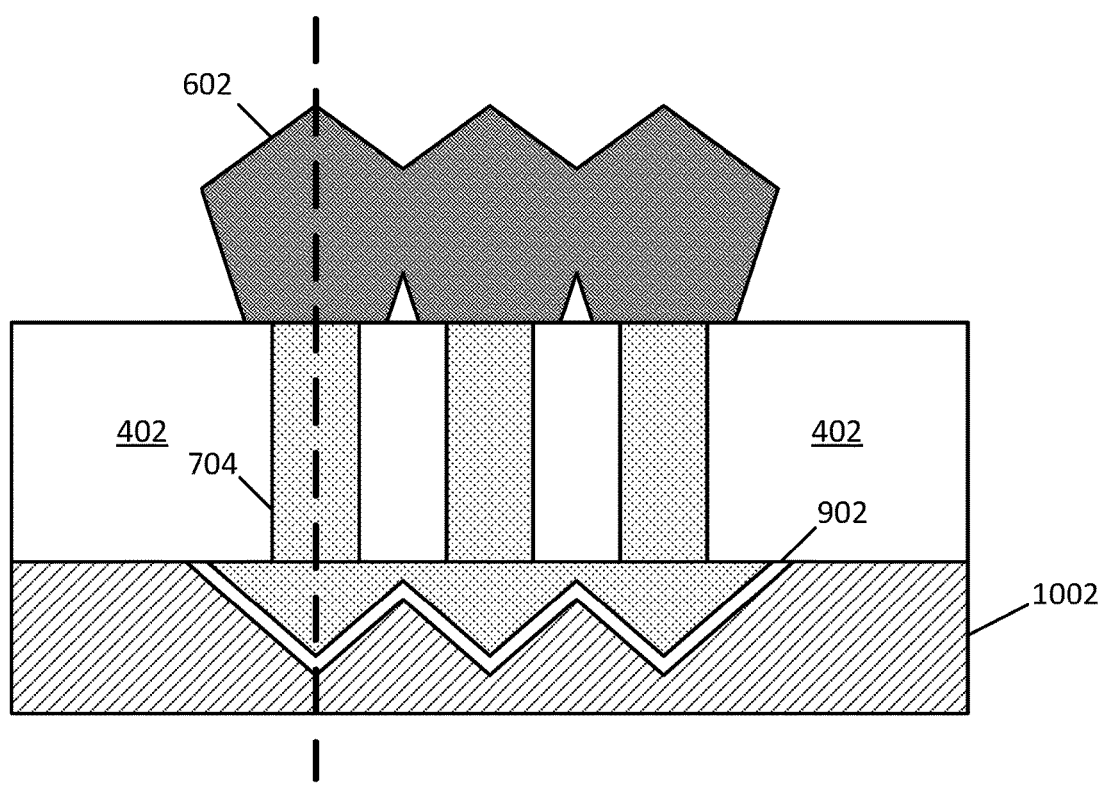
FIGS. 10A and 10B are different cross-sectional views that illustrate another stage in the example process for forming a semiconductor diode device that includes epitaxially formed backside regions, in accordance with an embodiment of the present disclosure.
Figure 10B:
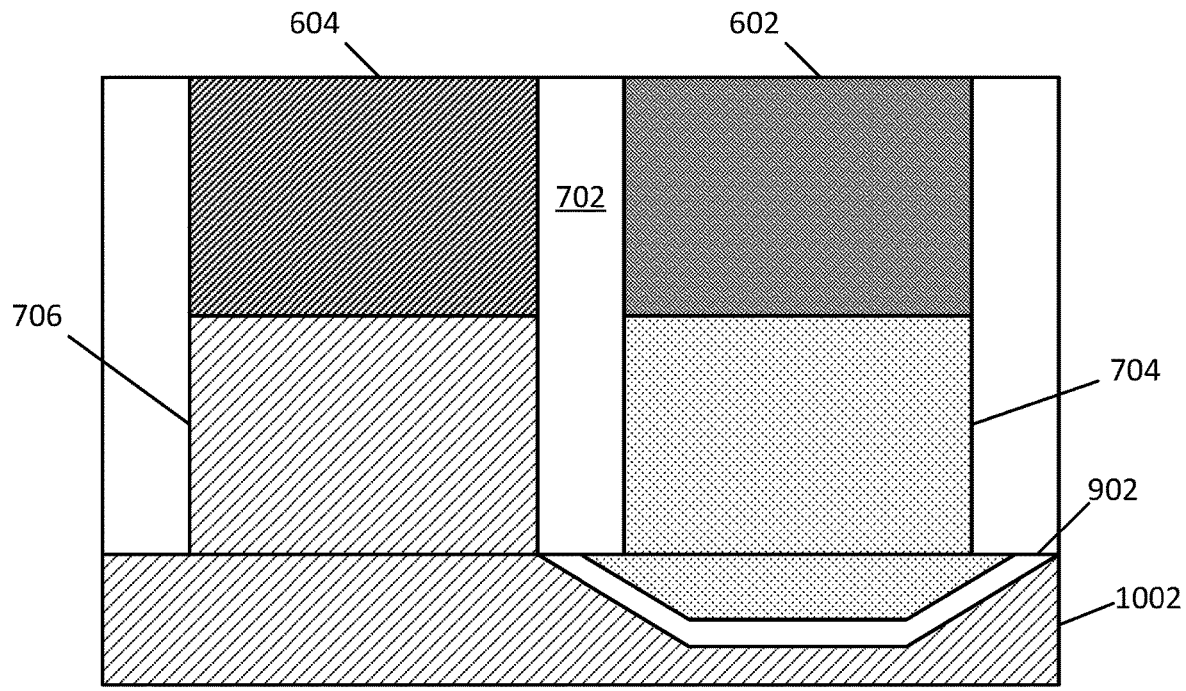

FIGS. 10A and 10B depict the cross-section views of the structure shown in FIGS. 9A and 9B, respectively, following the formation of a fourth epitaxial region 1002 beneath second fin 706, according to an embodiment. Hard mask layer 804 is removed and another epitaxial growth is performed to grow fourth epitaxial region 1002 on the lower surface of second fin 706. According to some embodiments, fourth epitaxial region 1002 also grows on semiconductor layer 902, such that fourth epitaxial region 1002 extends over and on both the lower surface of second fin 706 and semiconductor layer 902.

Because many device structures could be sensitive to high growth temperatures, the epitaxial growth process used to form fourth epitaxial region 1002 may be done at a lower temperature, such as between about 350° C. and 450° C. According to some embodiments, fourth epitaxial region 1002 includes a dopant concentration of the same dopant type as second fin 706 and second epitaxial region 604 that is less than the dopant concentration of the second epitaxial region 604. In some examples, fourth epitaxial region 1002 includes a dopant concentration that is substantially the same as a dopant concentration of second fin 706. According to an embodiment, fourth epitaxial region 1002 includes a dopant concentration of n-type dopants between $10^{16}$ cm$^{-3}$ and $10^{18}$ cm$^{-3}$.

The backside epitaxial growth processes complete the formation of a p-i-n diode that can be contacted from the frontside even when the substrate has been removed. In some embodiments, semiconductor layer 902 is omitted such that fourth epitaxial region 1002 grows directly on third epitaxial region 802 to form a p-n diode.

Figure 11:
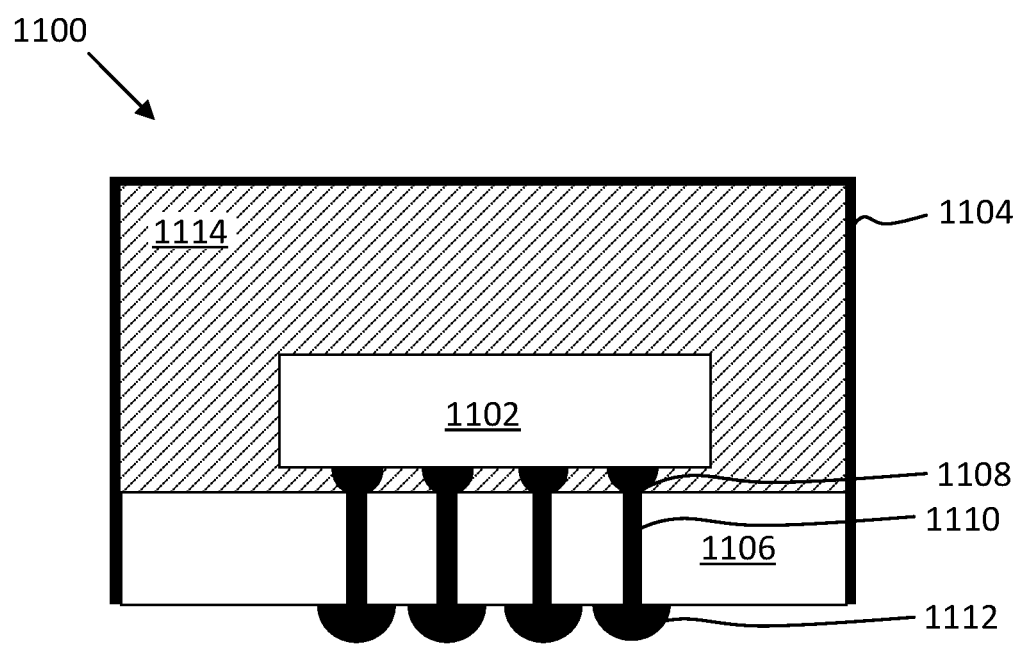
FIG. 11 illustrates a cross-section view of a chip package containing one or more semiconductor dies, in accordance with some embodiments of the present disclosure.

FIG. 11 illustrates an example embodiment of a chip package 1100, in accordance with an embodiment of the present disclosure. As can be seen, chip package 1100 includes one or more dies 1102. One or more dies 1102 may include at least one integrated circuit having semiconductor devices, such as any of the semiconductor devices disclosed herein. One or more dies 1102 may include any other circuitry used to interface with other devices formed on the dies, or other devices connected to chip package 1100, in some example configurations.

As can be further seen, chip package 1100 includes a housing 1104 that is bonded to a package substrate 1106. The housing 1104 may be any standard or proprietary housing, and may provide, for example, electromagnetic shielding and environmental protection for the components of chip package 1100. The one or more dies 1102 may be conductively coupled to a package substrate 1106 using connections 1108, which may be implemented with any number of standard or proprietary connection mechanisms, such as solder bumps, ball grid array (BGA), pins, or wire bonds, to name a few examples. Package substrate 1106 may be any standard or proprietary package substrate, but in some cases includes a dielectric material having conductive pathways (e.g., including conductive vias and lines) extending through the dielectric material between the faces of package substrate 1106, or between different locations on each face. In some embodiments, package substrate 1106 may have a thickness less than 1 millimeter (e.g., between 0.1 millimeters and 0.5 millimeters), although any number of package geometries can be used. Additional conductive contacts 1112 may be disposed at an opposite face of package substrate 1106 for conductively contacting, for instance, a printed circuit board (PCB). One or more vias 1110 extend through a thickness of package substrate 1106 to provide conductive pathways between one or more of connections 1108 to one or more of contacts 1112. Vias 1110 are illustrated as single straight columns through package substrate 1106 for ease of illustration, although other configurations can be used (e.g., damascene, dual damascene, through-silicon via, or an interconnect structure that meanders through the thickness of substrate 1106 to contact one or more intermediate locations therein). In still other embodiments, vias 1110 are fabricated by multiple smaller stacked vias, or are staggered at different locations across package substrate 1106. In the illustrated embodiment, contacts 1112 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 1112, to inhibit shorting.

In some embodiments, a mold material 1114 may be disposed around the one or more dies 1102 included within housing 1104 (e.g., between dies 1102 and package substrate 1106 as an underfill material, as well as between dies 1102 and housing 1104 as an overfill material). Although the dimensions and qualities of the mold material 1114 can vary from one embodiment to the next, in some embodiments, a thickness of mold material 1114 is less than 1 millimeter. Example materials that may be used for mold material 1114 include epoxy mold materials, as suitable. In some cases, the mold material 1114 is thermally conductive, in addition to being electrically insulating.

Methodology

Figure 12:
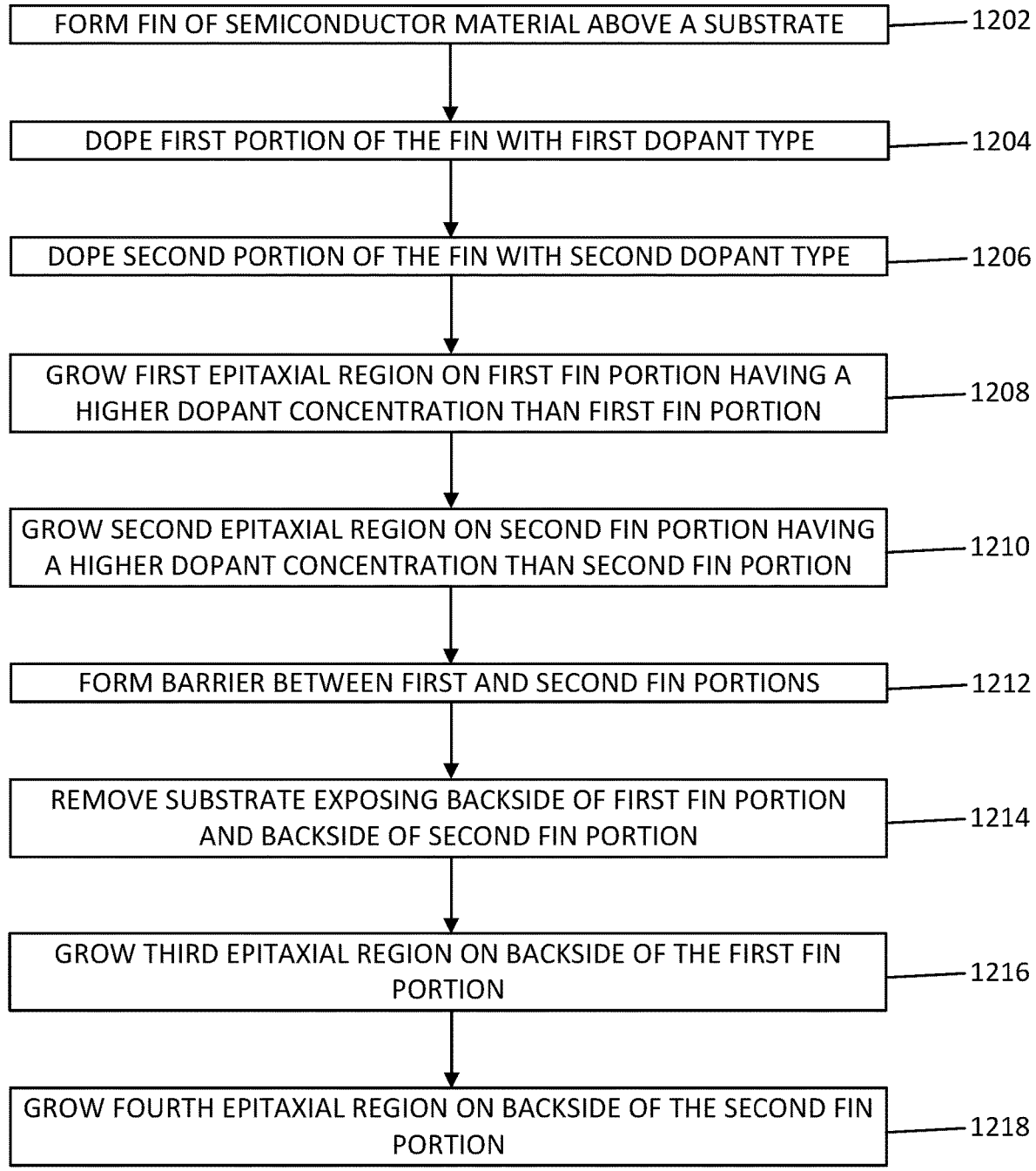
FIG. 12 is a flowchart of a fabrication process for a semiconductor diode device that includes epitaxially formed backside regions, in accordance with an embodiment of the present disclosure.

FIG. 12 is a flow chart of a method 1200 for forming at least a portion of an integrated circuit, such as a diode structure, according to an embodiment. Various operations of method 1200 may be illustrated in FIGS. 2A-10A and 2B-10B. However, the correlation of the various operations of method 1200 to the specific components illustrated in the aforementioned figures is not intended to imply any structural and/or use limitations. Rather, the aforementioned figures provide one example embodiment of method 1200. Other operations may be performed before, during, or after any of the operations of method 1200. Some of the operations of method 1200 may be performed in a different order than the illustrated order.

Method 1200 begins with operation 1202 where a semiconductor fin is formed above a substrate. The fin can be native to the underlying substrate or non-native to the substrate, or a multi-layer fin suitable for forming nanowires or nanoribbons. In some examples, the fin includes alternating layers of material. In other examples, the fin includes a single semiconductor material (e.g., silicon or germanium). Numerous other configurations can be used.

Method 1200 continues with operation 1204 where a first portion of the fin is doped with a first dopant type (e.g., n-type or p-type). Any doping process may be used to form the doped first portion of the fin, such as diffusion or ion implantation to form the doped first portion while masking another portion of the fin. In one example, the doped first portion of the fin includes a concentration of n-type dopants or p-type dopants in a range between $10^{16}$ cm$^{-3}$ and $10^{18}$ cm$^{-3}$. As noted above, n-type dopants may include either phosphorous or arsenic while p-type dopants may include boron.

Method 1200 continues with operation 1206 where a second portion of the fin is doped with a second dopant type different from the first dopant type. If the first dopant type is n-type, then the second dopant type is p-type and vice-versa. Any doping process may be used to form the doped second portion of the fin, such as diffusion or ion implantation to form the doped second portion while masking at least the first doped portion of the fin. In one example, the doped second portion of the fin includes a concentration of n-type dopants or p-type dopants in a range between $10^{16}$ cm$^{-3}$ and $10^{18}$ cm$^{-3}$. The doped first portion of the fin may include substantially the same dopant concentration as the second doped portion of the fin.

The first doped portion of the fin and the second doped portion of the fin may be directly adjacent within the fin. In some other embodiments, the doped portions do not overlap or abut such that a portion of the fin exists between the doped portions that is not doped via either doping process used to form the first doped portion and the second doped portion.

Method 1200 continues with operation 1208 where a first epitaxial region is grown on the first portion of the fin. According to some embodiments, the first epitaxial region has a higher dopant concentration of the same dopant type as the first portion of the fin. Accordingly, the first epitaxial region may include a semiconductor material having a dopant concentration of p-type or n-type dopants (matching the dopant type of the first portion of the fin) between $10^{20}$ cm$^{-3}$ and $10^{21}$ cm$^{-3}$. The semiconductor material of the first epitaxial region may be the same semiconductor material as the fin (e.g., silicon or silicon germanium). In some embodiments, the first portion of the fin is first etched to form a recess and the first epitaxial region is grown within the recess.

Method 1200 continues with operation 1210 where a second epitaxial region is grown on the second portion of the fin. According to some embodiments, the second epitaxial region has a higher dopant concentration of the same dopant type as the second portion of the fin (and consequently the opposite dopant type from the first epitaxial region). Accordingly, the second epitaxial region may include a semiconductor material having a dopant concentration of p-type or n-type dopants (matching the dopant type of the second portion of the fin) between $10^{20}$ cm$^{-3}$ and $10^{21}$ cm$^{-3}$. In some embodiments, the dopant concentration of the second epitaxial region is substantially the same as the dopant concentration of the first epitaxial region. The semiconductor material of the second epitaxial region may be the same semiconductor material as the fin (e.g., silicon or silicon germanium). In some embodiments, the second portion of the fin is first etched to form a recess and the second epitaxial region is grown within the recess.

Method 1200 continues with operation 1212 where a barrier is formed between the first and second fin portions. According to some embodiments, the barrier also extends vertically such that it is also between the first epitaxial region and the second epitaxial region. According to some embodiments, an anisotropic etch is performed between the first epitaxial region and the second epitaxial region that extends down through the height of the fin until at least a portion of the substrate 202 is exposed. The recess formed by the etch may then be filled with any suitable dielectric material to form the barrier. One example dielectric material is silicon oxide. Other dielectric barriers may also be formed to isolate the doped fin portions from any other adjacent devices. The barrier may have a width between the doped fin portions of between about 50 nm and about 100 nm. The formation of the barrier between the doped fin portions may be thought of as forming two separate fins—the first fin portion becomes a first fin and the second fin portion becomes a second fin.

Method 1200 continues with operation 1214 where the underlying semiconductor substrate is removed from the backside. The bulk material of the substrate may be removed until the bottom surfaces of the first and second doped fin portions are exposed from the backside, according to some embodiments. The substrate material may be removed using, for example, CMP or vapor phase etchants.

Method 1200 continues with operation 1216 where a third epitaxial region is grown on the backside of the first portion of the fin. The exposed bottom surface of the second portion of the fin may be protected using a hard mask layer or other similar masking layer during the backside growth of epitaxial material from the first fin portion. Because many device structures could be sensitive to high growth temperatures, the epitaxial growth process used to form the third epitaxial region may be done at a lower temperature, such as between about 350° C. and 450° C. According to some embodiments, the third epitaxial region includes a dopant concentration of the same dopant type as the first fin portion and the first epitaxial region that is less than the dopant concentration of the first epitaxial region. In some examples, the third epitaxial region includes a dopant concentration that is substantially the same as a dopant concentration of the first fin portion. According to an embodiment, the third epitaxial region includes a dopant concentration of n-type dopants or p-type dopants (matching the dopant type of the first portion of the fin) between $10^{16}$ cm$^{-3}$ and $10^{18}$ cm$^{-3}$.

In some embodiments, an undoped or very lightly doped (e.g., dopant concentration of less than $10^{15}$ cm$^{-3}$) semiconductor layer is grown or otherwise deposited on the bottom surface of the third epitaxial region. The semiconductor layer may have a thickness between about 5 nm and about 20 nm.

Method 1200 continues with operation 1218 where a fourth epitaxial region is grown on the backside of the second portion of the fin. Because many device structures could be sensitive to high growth temperatures, the epitaxial growth process used to form the fourth epitaxial region may be done at a lower temperature, such as between about 350° C. and 450° C. According to some embodiments, the fourth epitaxial region includes a dopant concentration of the same dopant type as the second fin portion and the second epitaxial region that is less than the dopant concentration of the second epitaxial region. In some examples, the fourth epitaxial region includes a dopant concentration that is substantially the same as a dopant concentration of the second fin portion. According to an embodiment, the fourth epitaxial region includes a dopant concentration of n-type dopants or p-type dopants (matching the dopant type of the second portion of the fin) between $10^{16}$ cm$^{-3}$ and $10^{18}$ cm$^{-3}$. In some embodiments, the fourth epitaxial region includes a dopant concentration that is substantially the same as the dopant concentration of the third epitaxial region. The fourth epitaxial region may be grown from both the backside of the second portion of the fin and also from the backside of the third epitaxial region to form a p-n junction between the third epitaxial region and the fourth epitaxial region. In some other embodiments, the fourth epitaxial region is grown from both the backside of the second portion of the fin and also from the backside of the semiconductor layer to form a p-i-n junction between the third epitaxial region, the semiconductor layer, and the fourth epitaxial region.

Example System

Figure 13:
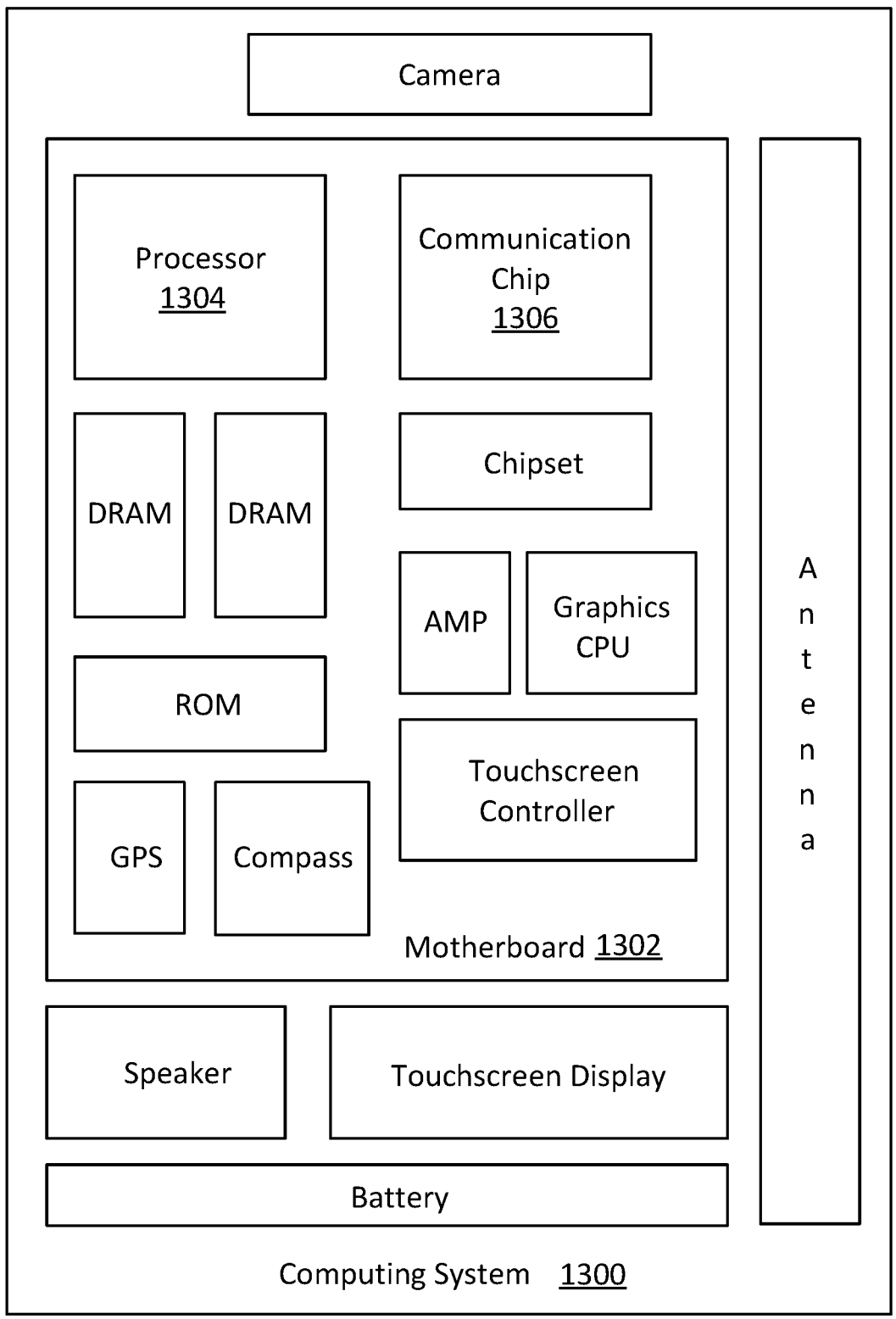
FIG. 13 illustrates a computing system including one or more integrated circuits, as variously described herein, in accordance with an embodiment of the present disclosure.

FIG. 13 is an example computing system implemented with one or more of the integrated circuit structures as disclosed herein, in accordance with some embodiments of the present disclosure. As can be seen, the computing system 1300 houses a motherboard 1302. The motherboard 1302 may include a number of components, including, but not limited to, a processor 1304 and at least one communication chip 1306, each of which can be physically and electrically coupled to the motherboard 1302, or otherwise integrated therein. As will be appreciated, the motherboard 1302 may be, for example, any printed circuit board (PCB), whether a main board, a daughterboard mounted on a main board, or the only board of system 1300, etc.

Depending on its applications, computing system 1300 may include one or more other components that may or may not be physically and electrically coupled to the motherboard 1302. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1300 may include one or more integrated circuit structures or devices configured in accordance with an example embodiment (e.g., a module including an integrated circuit having one or more diode devices with backside epitaxial regions, as variously provided herein). In some embodiments, multiple functions can be integrated into one or more chips (e.g., for instance, note that the communication chip 1306 can be part of or otherwise integrated into the processor 1304).

The communication chip 1306 enables wireless communications for the transfer of data to and from the computing system 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1300 may include a plurality of communication chips 1306. For instance, a first communication chip 1306 may be dedicated to shorter range wireless communications such as Wi-Fi and Bluetooth and a second communication chip 1306 may be dedicated to longer range wireless communications such as GPS, EDGE, GPRS, CDMA, WiMAX, LTE, Ev-DO, and others.

The processor 1304 of the computing system 1300 includes an integrated circuit die packaged within the processor 1304. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 1306 also may include an integrated circuit die packaged within the communication chip 1306. In accordance with some such example embodiments, the integrated circuit die of the communication chip includes one or more semiconductor devices as variously described herein. As will be appreciated in light of this disclosure, note that multi-standard wireless capability may be integrated directly into the processor 1304 (e.g., where functionality of any chips 1306 is integrated into processor 1304, rather than having separate communication chips). Further note that processor 1304 may be a chip set having such wireless capability. In short, any number of processor 1304 and/or communication chips 1306 can be used. Likewise, any one chip or chip set can have multiple functions integrated therein.

In various implementations, the computing system 1300 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 1300 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a first fin having semiconductor material doped with a first dopant type at a first dopant concentration, a second fin having semiconductor material doped with a second dopant type at a second dopant concentration, and an insulating barrier between the first fin and the second fin. The integrated circuit further includes a first epitaxial region over and on the first fin, a second epitaxial region over and on the second fin, a third epitaxial region under and on the first fin, and a fourth epitaxial region under and on the second fin. The first epitaxial region has semiconductor material doped with the first dopant type at a third dopant concentration higher than the first dopant concentration. The second epitaxial region has semiconductor material doped with the second dopant type at a fourth dopant concentration higher than the second dopant concentration. The third epitaxial region has semiconductor material doped with the first dopant type at a fifth dopant concentration lower than the third dopant concentration. The fourth epitaxial region has semiconductor material doped with the second dopant type at a sixth dopant concentration lower than the fourth dopant concentration.

Example 2 includes the subject matter of Example 1, wherein each of the first fin and the second fin comprise silicon.

Example 3 includes the subject matter of Example 1 or 2, wherein the first dopant type is p-type and the second dopant type is n-type.

Example 4 includes the subject matter of any one of Examples 1-3, further comprising a dielectric layer adjacent to both the first fin and the second fin.

Example 5 includes the subject matter of any one of Examples 1-4, wherein the insulating barrier comprises silicon oxide, silicon nitride, or silicon oxynitride.

Example 6 includes the subject matter of any one of Examples 1-5, wherein the insulating barrier further extends between the first epitaxial region and the second epitaxial region.

Example 7 includes the subject matter of any one of Examples 1-6, further comprising a layer of semiconductor material on the third epitaxial region, the layer being undoped or otherwise having a dopant concentration that is less than that of each of the third and fourth epitaxial regions.

Example 8 includes the subject matter of Example 7, wherein the fourth epitaxial region extends onto the layer.

Example 9 includes the subject matter of Example 7 or 8, wherein the layer comprises undoped silicon.

Example 10 includes the subject matter of any one of Examples 1-9, wherein the first dopant concentration is substantially equal to the fifth dopant concentration.

Example 11 includes the subject matter of any one of Examples 1-10, wherein the second dopant concentration is substantially equal to the sixth dopant concentration.

Example 12 includes the subject matter of any one of Examples 1-11, wherein each of the first dopant concentration and the second dopant concentration is between $10^{16}$ cm$^{-3}$ and $10^{18}$ cm$^{-3}$.

Example 13 includes the subject matter of Example 12, wherein each of the third dopant concentration and the fourth dopant concentration is between $10^{20}$ cm$^{-3}$ and $10^{21}$ cm$^{-3}$.

Example 14 includes the subject matter of any one of Examples 1-13, wherein the fourth epitaxial region extends onto the third epitaxial region.

Example 15 is a printed circuit board comprising the integrated circuit of any one of Examples 1-14.

Example 16 is an electronic device that includes a chip package comprising one or more dies. At least one of the one or more dies includes a first fin having semiconductor material doped with a first dopant type at a first dopant concentration, a second fin having semiconductor material doped with a second dopant type at a second dopant concentration, and an insulating barrier between the first fin and the second fin. The integrated circuit further includes a first epitaxial region over and on the first fin, a second epitaxial region over and on the second fin, a third epitaxial region under and on the first fin, and a fourth epitaxial region under and on the second fin. The first epitaxial region has semiconductor material doped with the first dopant type at a third dopant concentration higher than the first dopant concentration. The second epitaxial region has semiconductor material doped with the second dopant type at a fourth dopant concentration higher than the second dopant concentration. The third epitaxial region has semiconductor material doped with the first dopant type at a fifth dopant concentration lower than the third dopant concentration. The fourth epitaxial region has semiconductor material doped with the second dopant type at a sixth dopant concentration lower than the fourth dopant concentration.

Example 17 includes the subject matter of Example 16, wherein each of the first fin and the second fin comprise silicon.

Example 18 includes the subject matter of Example 16 or 17, wherein the first dopant type is p-type and the second dopant type is n-type.

Example 19 includes the subject matter of any one of Examples 16-18, further comprising a dielectric layer adjacent to both the first fin and the second fin.

Example 20 includes the subject matter of any one of Examples 16-19, wherein the insulating barrier comprises silicon oxide, silicon nitride, or silicon oxynitride.

Example 21 includes the subject matter of any one of Examples 16-20, wherein the insulating barrier further extends between the first epitaxial region and the second epitaxial region.

Example 22 includes the subject matter of any one of Examples 16-21, wherein the one or more dies further comprises a layer of semiconductor material on the third epitaxial region, the layer being undoped or otherwise having a dopant concentration that is less than that of each of the third and fourth epitaxial regions.

Example 23 includes the subject matter of Example 22, wherein the fourth epitaxial region extends onto the layer.

Example 24 includes the subject matter of Example 22 or 23, wherein the layer comprises undoped silicon.

Example 25 includes the subject matter of any one of Examples 16-24, wherein the first dopant concentration is substantially equal to the fifth dopant concentration.

Example 26 includes the subject matter of any one of Examples 16-25, wherein the second dopant concentration is substantially equal to the sixth dopant concentration.

Example 27 includes the subject matter of any one of Examples 16-26, wherein each of the first dopant concentration and the second dopant concentration is between $10^{16}$ cm$^{-3}$ and $10^{18}$ cm$^{-3}$.

Example 28 includes the subject matter of Example 27, wherein each of the third dopant concentration and the fourth dopant concentration is between $10^{20}$ cm$^{-3}$ and $10^{21}$ cm$^{-3}$.

Example 29 includes the subject matter of any one of Examples 16-28, wherein the fourth epitaxial region extends onto the third epitaxial region.

Example 30 includes the subject matter of any one of Examples 16-29, further comprising a printed circuit board, wherein the chip package is attached to the printed circuit board.

Example 31 is an integrated circuit that includes a first body of semiconductor material doped with a first dopant type at a first dopant concentration, a second body of semiconductor material doped with a second dopant type at a second dopant concentration, and an insulating barrier between the first body and the second body. The integrated circuit also includes a first epitaxial region on a first end of the first body, a second epitaxial region on a first end of the second body, a third epitaxial region on a second end of the first body opposite from the first end of the first body, and a fourth epitaxial region on a second end of the second body opposite from the first end of the second body. The first epitaxial region has semiconductor material doped with the first dopant type at a third dopant concentration higher than the first dopant concentration. The second epitaxial region has semiconductor material doped with the second dopant type at a fourth dopant concentration higher than the second dopant concentration. The third epitaxial region has semiconductor material doped with the first dopant type at a fifth dopant concentration lower than the third dopant concentration. The fourth epitaxial region has semiconductor material doped with the second dopant type at a sixth dopant concentration lower than the fourth dopant concentration.

Example 32 includes the subject matter of Example 31, further comprising a layer comprising semiconductor material on the third epitaxial region, the layer being undoped or otherwise having a dopant concentration that is less than that of each of the third and fourth epitaxial regions.

Example 33 includes the subject matter of Example 32, wherein the fourth epitaxial region is further on the layer.

Example 34 includes the subject matter of Example 32 or 33, wherein the layer comprises undoped silicon.

Example 35 includes the subject matter of Example 31, wherein the fourth epitaxial region is further on the third epitaxial region.

Example 36 is a printed circuit board comprising the integrated circuit of any one of Examples 31-35.

Example 37 is a method of forming an integrated circuit. The method includes forming a fin of semiconductor material extending above a semiconductor substrate; doping a first portion of the fin with a first dopant type at a first dopant concentration and doping a second portion of the fin with a second dopant type at a second dopant concentration; growing a first epitaxial region on the first portion of the fin, the first epitaxial region having the first dopant type at a third dopant concentration higher than the first dopant concentration; growing a second epitaxial region on the second portion of the fin, the second epitaxial region having the second dopant type at a fourth dopant concentration higher than the second dopant concentration; forming an insulating barrier between the first portion of the fin and the second portion of the fin; removing the semiconductor substrate to expose a backside of the first portion of the fin and a backside of the second portion of the fin; growing a third epitaxial region on the backside of the first portion of the fin, the third epitaxial region having the first dopant type at a fifth dopant concentration lower than the third dopant concentration; and growing a fourth epitaxial region on the backside of the second portion of the fin, the fourth epitaxial region having the second dopant type at a sixth dopant concentration lower than the fourth dopant concentration.

Example 38 includes the subject matter of Example 37, further comprising growing an undoped semiconductor layer on the third epitaxial region.

Example 39 includes the subject matter of Example 38, wherein growing the fourth epitaxial region further comprises growing the fourth epitaxial region on the undoped semiconductor layer.

Example 40 includes the subject matter of any one of Examples 37-39, wherein growing the third epitaxial region comprises growing the third epitaxial region at a temperature between about 350° C. and about 450° C., and growing the fourth epitaxial region comprises growing the fourth epitaxial region at a temperature between about 350° C. and about 450° C.

Example 41 includes the subject matter of any one of Examples 37-40, wherein the first dopant concentration is substantially equal to the fifth dopant concentration.

Example 42 includes the subject matter of any one of Examples 37-41, wherein the second dopant concentration is substantially equal to the sixth dopant concentration.

Example 43 includes the subject matter of any one of Examples 37-42, wherein each of the first dopant concentration and the second dopant concentration is between $10^{16}$ cm$^{-3}$ and $10^{18}$ cm$^{-3}$.

Example 44 includes the subject matter of Example 43, wherein each of the third dopant concentration and the fourth dopant concentration is between $10^{20}$ cm$^{-3}$ and $10^{21}$ cm$^{-3}$.

The foregoing description of the embodiments of the disclosure has been presented for the purposes of illustration and description. It is not intended to be exhaustive or to limit the disclosure to the precise forms disclosed. Many modifications and variations are possible in light of this disclo-

What is claimed is:

1. An integrated circuit comprising:
a first fin having semiconductor material doped with a first dopant type at a first dopant concentration;
a second fin extending colinearly along its length with the first fin and having semiconductor material doped with a second dopant type at a second dopant concentration;
an insulating barrier between the first fin and the second fin;
a first epitaxial region over and on the first fin, the first epitaxial region having semiconductor material doped with the first dopant type at a third dopant concentration higher than the first dopant concentration;
a second epitaxial region over and on the second fin, the second epitaxial region having semiconductor material doped with the second dopant type at a fourth dopant concentration higher than the second dopant concentration;
a third epitaxial region under and on the first fin, the third epitaxial region having semiconductor material doped with the first dopant type at a fifth dopant concentration lower than the third dopant concentration; and
a fourth epitaxial region under and on the second fin, the fourth epitaxial region having semiconductor material doped with the second dopant type at a sixth dopant concentration lower than the fourth dopant concentration.

2. The integrated circuit of claim 1, wherein the first dopant type is p-type and the second dopant type is n-type.

3. The integrated circuit of claim 1, wherein the insulating barrier further extends between the first epitaxial region and the second epitaxial region.

4. The integrated circuit of claim 1, further comprising a layer of semiconductor material on the third epitaxial region, the layer being undoped or otherwise having a dopant concentration that is less than that of each of the third and fourth epitaxial regions.

5. The integrated circuit of claim 4, wherein the fourth epitaxial region extends onto the layer.

6. The integrated circuit of claim 1, wherein the first dopant concentration is substantially equal to the fifth dopant concentration, and the second dopant concentration is substantially equal to the sixth dopant concentration.

7. A die comprising the integrated circuit of claim 1.

8. An electronic device, comprising:
one or more dies comprising
a first fin having semiconductor material doped with a first dopant type at a first dopant concentration;
a second fin extending colinearly along its length with the first fin and having semiconductor material doped with a second dopant type at a second dopant concentration;
an insulating barrier between the first fin and the second fin;
a first epitaxial region over and on the first fin, the first epitaxial region having semiconductor material doped with the first dopant type at a third dopant concentration higher than the first dopant concentration;
a second epitaxial region over and on the second fin, the second epitaxial region having semiconductor material doped with the second dopant type at a fourth dopant concentration higher than the second dopant concentration;
a third epitaxial region under and on the first fin, the third epitaxial region having semiconductor material doped with the first dopant type at a fifth dopant concentration lower than the third dopant concentration; and
a fourth epitaxial region under and on the second fin, the fourth epitaxial region having semiconductor material doped with the second dopant type at a sixth dopant concentration lower than the fourth dopant concentration.

9. The electronic device of claim 8, wherein the insulating barrier further extends between the first epitaxial region and the second epitaxial region.

10. The electronic device of claim 8, wherein the one or more dies further comprises a layer of semiconductor material on the third epitaxial region, the layer being undoped or otherwise having a dopant concentration that is less than that of each of the third and fourth epitaxial regions.

11. The electronic device of claim 10, wherein the fourth epitaxial region extends onto the layer.

12. The electronic device of claim 8, wherein the first dopant concentration is substantially equal to the fifth dopant concentration and the second dopant concentration is substantially equal to the sixth dopant concentration.

13. The electronic device of claim 8, wherein the fourth epitaxial region extends onto the third epitaxial region.

14. The electronic device of claim 8, further comprising a printed circuit board, wherein the one or more dies are attached to the printed circuit board.

15. An integrated circuit comprising:
a first body of semiconductor material doped with a first dopant type at a first dopant concentration;
a second body of semiconductor material extending colinearly along its length with the first body of semiconductor material and doped with a second dopant type at a second dopant concentration;
an insulating barrier between the first body and the second body;
a first epitaxial region on a first end of the first body, the first epitaxial region having semiconductor material doped with the first dopant type at a third dopant concentration higher than the first dopant concentration;
a second epitaxial region on a first end of the second body, the second epitaxial region having semiconductor material doped with the second dopant type at a fourth dopant concentration higher than the second dopant concentration;
a third epitaxial region on a second end of the first body opposite from the first end of the first body, the third epitaxial region having semiconductor material doped with the first dopant type at a fifth dopant concentration lower than the third dopant concentration; and
a fourth epitaxial region on a second end of the second body opposite from the first end of the second body, the fourth epitaxial region having semiconductor material doped with the second dopant type at a sixth dopant concentration lower than the fourth dopant concentration.

16. The integrated circuit of claim 15, further comprising a layer comprising semiconductor material on the third epitaxial region, the layer being undoped or otherwise having a dopant concentration that is less than that of each of the third and fourth epitaxial regions.

17. The integrated circuit of claim 16, wherein the fourth epitaxial region is further on the layer.

18. The integrated circuit of claim 16, wherein the layer comprises undoped silicon.

19. The integrated circuit of claim 15, wherein the fourth epitaxial region is further on the third epitaxial region.

20. A die comprising the integrated circuit of claim 15.

* * * * *